US012813110B2

(12) United States Patent
Youk et al.

(10) Patent No.: US 12,813,110 B2
(45) Date of Patent: Nov. 24, 2026

(54) DISPLAY DEVICE

(71) Applicant: Samsung Display Co., Ltd., Yongin-si (KR)

(72) Inventors: Kikyung Youk, Yongin-si (KR); Hongam Kim, Yongin-si (KR); Seungsue Ryu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 305 days.

(21) Appl. No.: 18/771,231

(22) Filed: Jul. 12, 2024

(65) Prior Publication Data

US 2025/0031539 A1 Jan. 23, 2025

(30) Foreign Application Priority Data

Jul. 19, 2023 (KR) ........................ 10-2023-0093731

(51) Int. Cl.

*H10K 59/131* (2023.01)
*H10K 59/38* (2023.01)
*H10K 59/40* (2023.01)
*H10K 59/88* (2023.01)

(52) U.S. Cl.

CPC ........... *H10K 59/131* (2023.02); *H10K 59/38* (2023.02); *H10K 59/40* (2023.02); *H10K 59/88* (2023.02)

(58) Field of Classification Search

CPC ...... H10K 59/131; H10K 59/38; H10K 59/40; H10K 59/88; H10K 59/873; H10K 59/122; H10K 59/82; H10K 59/875; H10K 71/10

See application file for complete search history.

(56) References Cited

U.S. PATENT DOCUMENTS 8,766,265 B2 * 7/2014 Lee .................... H10D 30/6739 257/E33.053
11,362,250 B2 * 6/2022 Kim ................... H10D 30/6723
2021/0328107 A1 * 10/2021 An .......................... H10K 59/12
2022/0375997 A1 * 11/2022 Sung ...................... G06F 3/0412
2023/0111574 A1 * 4/2023 Lee .................... H10K 59/8792 257/40

FOREIGN PATENT DOCUMENTS

KR 10-1837625 3/2018

* cited by examiner

*Primary Examiner* — Mark W Tornow

(57) ABSTRACT

A display device that includes a light emitting element disposed on a display area, a first signal pad electrically connected to the light emitting element and disposed in a non-display area adjacent to the display area, and a second signal pad spaced apart disposed in the non-display area. The display device may include an insulating layer overlapping an edge of the first signal pad and an edge of the second signal pad and disposed in the non-display area; a lighting circuit part disposed between the first signal pad and the second signal pad on the non-display area, and an organic protection layer overlapping the lighting circuit part and disposed in the non-display area, The insulating layer may be disposed between the lighting circuit part and the organic protection layer. Therefore, the display device may exhibit excellent reliability.

20 Claims, 28 Drawing Sheets

DISPLAY DEVICE

CROSS-REFERENCE TO RELATED APPLICATIONS

This application claims priority under 35 U.S.C. § 119 from Korean Patent Application No. 10-2023-0093731 filed on Jul. 19, 2023 in the Korean Intellectual Property Office, the entire contents of which are incorporated herein by reference.

BACKGROUND

1. Technical Field

This disclosure relates to a display device including a display panel of which an area may be bent.

2. Description of the Related Art

Various display devices used in multimedia devices such as televisions, mobile phones, table computers, navigation devices, and game consoles are being developed. Such display devices may include a display panel that displays an image and senses an external input.

The display panel may be electrically bonded to a driving chip that may provide an electrical signal that may be desirable for displaying an image. An area on which the driving chip may be placed may be a non-display area on which no image may be displayed, and an area of the display panel may be bent to reduce the non-display area. Cracks may occur due to bending stress on an area adjacent to the area being bent, and research for preventing cracks from occurring may be needed.

SUMMARY

The disclosure provides a display device that exhibits excellent reliability.

An embodiment of the inventive concept provides a display device that may include a light emitting element disposed on a display area; a first signal pad electrically connected to the light emitting element and disposed in a non-display area adjacent to the display area; a second signal pad disposed in the non-display area, the first signal pad may be disposed between the display area and the second signal pad; an insulating layer overlapping an edge of the first signal pad and an edge of the second signal pad and disposed in the non-display area; a lighting circuit part disposed between the first signal pad and the second signal pad in the non-display area; and an organic protection layer overlapping the lighting circuit part, wherein the insulating layer may be disposed between the lighting circuit part and the organic protection layer.

In an embodiment, the organic protection layer may not overlap the first signal pad and the second signal pad.

In an embodiment, a protection opening through which at least one of the first signal pad and the second signal pad is exposed may be defined in the organic protection layer.

In an embodiment, the display device may further include an input sensing layer disposed on the light emitting element and including a sensing conductive layer and a sensing insulating layer disposed on the sensing conductive layer and, wherein the organic protection layer and the sensing insulating layer may include a same organic material.

In an embodiment, the display device may further include an optical layer including at least one of a dye or a pigment and disposed on the light emitting element, and the organic protection layer and the optical layer may include a same organic material.

In an embodiment, the optical layer may include an optical pattern part in which a pattern opening may be defined; and a light control layer disposed in the pattern opening, the light control layer may include at least one of the dye and the pigment, and the light control layer may be a planarization layer, and the organic protection layer and the light control layer may include a same organic material.

In an embodiment, the optical layer may include: an optical pattern part in which a pattern opening may be defined; a filter part in the pattern opening, the filter part may include at least one of the dye and the pigment; and an overcoat layer disposed on the optical pattern part and the filter part, wherein the organic protection layer and the overcoat layer may include a same organic material.

In an embodiment, the light emitting element may include a first electrode, a second electrode disposed on the first electrode, and an emission layer disposed between the first electrode and the second electrode, and the filter part may overlap the emission layer.

In an embodiment, the insulating layer may include a first opening through which the first signal pad may be exposed and a second opening through which the second signal pad may be exposed.

In an embodiment, the lighting circuit part may include an inspection line, the inspection line and at least one of the first signal pad and the second signal pad may be disposed on a same layer.

In an embodiment, the display device may further include a first insulating pattern disposed to correspond to the edge of the first signal pad and a second insulating pattern disposed to correspond to the edge of the second signal pad, wherein the insulating layer may be disposed on the first insulating pattern and the second insulating pattern.

In an embodiment of the inventive concept, a display device may include a light emitting element disposed in a display area; a first signal pad electrically connected to the light emitting element and disposed in a non-display area adjacent to the display area; a second signal pad disposed in the non-display area, the first signal pad may be disposed between the display area and the second signal pad; an insulating layer overlapping an edge of the first signal pad and an edge of the second signal pad and disposed in the non-display area; a lighting circuit part disposed between the first signal pad and the second signal pad in the non-display area; and an organic protection layer disposed on the lighting circuit part, wherein the insulating layer may include a first opening through which the first signal pad may be exposed; a second opening through which the second signal pad may be exposed; and at least one third opening disposed between the first opening and the second opening.

In an embodiment, the at least one third opening may overlap the lighting circuit part.

In an embodiment, the organic protection layer may be exposed through the at least one third opening.

In an embodiment, the at least one third opening may be defined between the first signal pad and the lighting circuit part and between the lighting circuit part and the second signal pad.

In an embodiment, in a plan view, the at least one third opening may include a plurality of third openings, and the plurality of third openings may be spaced side by side from each other in one direction.

In an embodiment in a plan view, the at least one third opening may include a first portion, a second portion intersecting the first portion, and an intersection disposed between the first portion and the second portion.

In an embodiment, in a plan view, the at least one third opening may have a curved portion.

In an embodiment, a protection opening may be defined in the organic protection layer, and the protection opening may overlap the first opening and the second opening In an embodiment, the insulating layer may further include at least one fourth opening that overlaps the protection opening, the at least one fourth opening may be spaced apart from the at least one third opening, at least one of the first opening and the second opening may be disposed between the at least one third opening and the at least one fourth opening, the at least one fourth opening may include a plurality of fourth openings, the plurality of fourth openings may be spaced side by side from each other in a direction in a plan view, and each of the plurality of fourth openings comprises one of a curved design or a straight segment design in a plan view, wherein the straight segment design may include a first sub portion, a second sub portion intersecting the first sub portion, and a sub intersection disposed between the first sub portion and the second sub portion.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
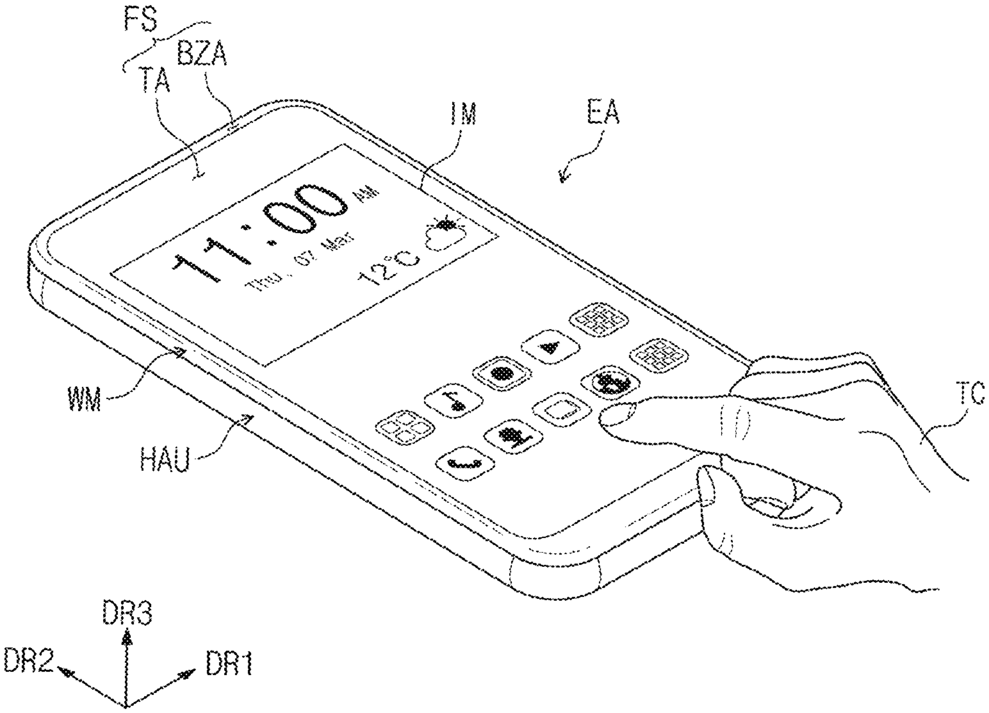
FIG. 1 is a perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Hereinafter, a display device according to an embodiment of the inventive concept will be described with reference to the accompanying drawings.

Figure 2:
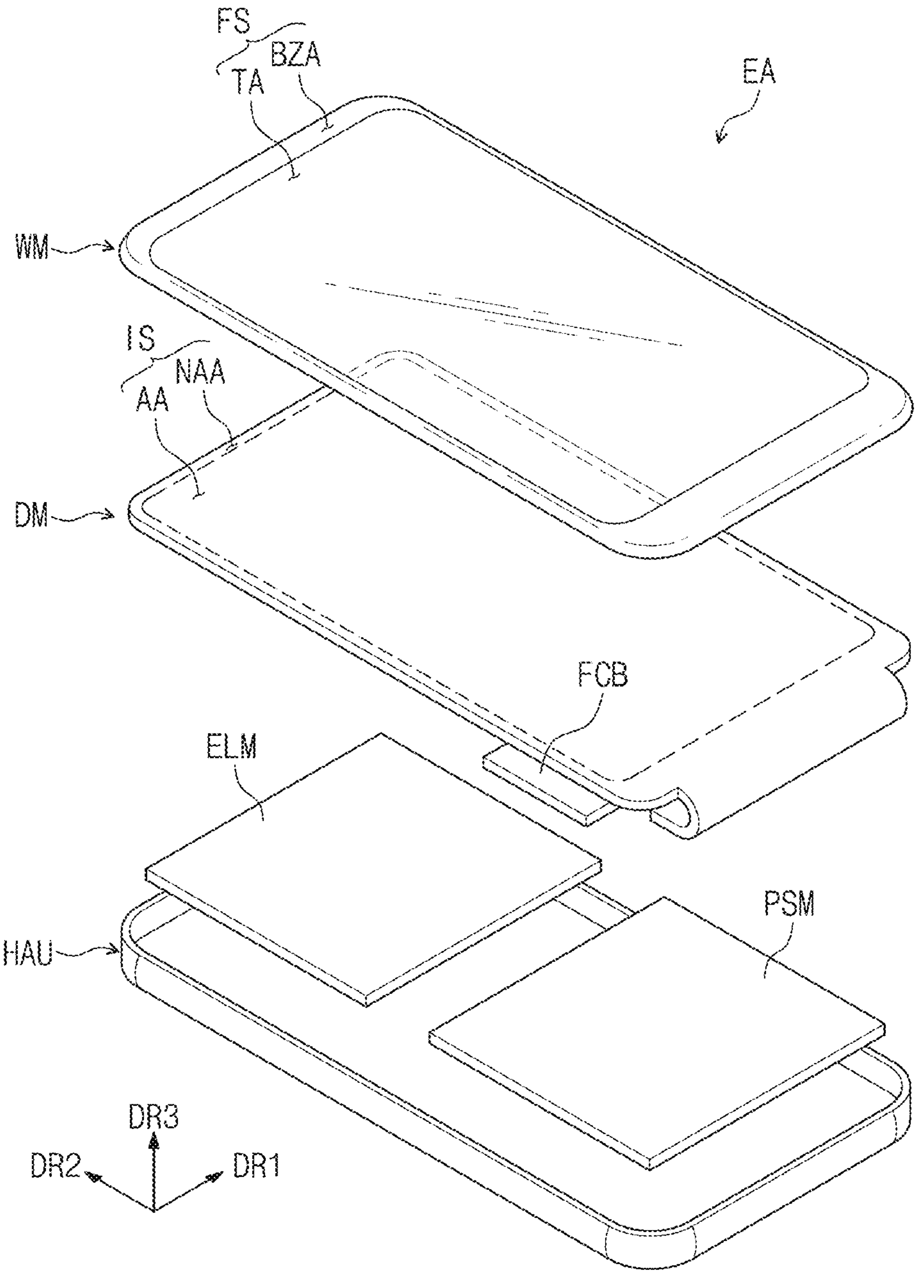
FIG. 2 is an exploded perspective view of the display device according to an embodiment.

FIG. 1 is a perspective view of a display device EA according to an embodiment. FIG. 2 is an exploded perspective view of the display device EA according to an embodiment. Referring to FIGS. 1 and 2, the display device EA may be a device that may be activated according to an electrical signal, displays an image IM, and senses an external input TC. For example, the display device EA may be a mobile phone, a tablet PC, navigation system, a game console, or a wearable device, but the embodiment of the inventive concept may not be limited thereto. FIG. 1 illustrates an example in which the display device EA may be a mobile phone.

The display device EA may be rigid or flexible. The "flexible" means a bendable property and may include a structure that may be completely folded to a few nanometers. For example, the flexible display device EA may include a curved display device, a rollable display device, or a foldable display device.

The display device EA may display the image IM through a display surface FS parallel to a plane defined by a first direction DR1 and a second direction DR2. The image IM may include a still image as well as a dynamic image. In FIG. 1, the image IM may be illustrated as a watch and icons as an example.

The display surface FS of the display device EA may include only an approximately flat surface or may further include a curved surface bent from at least a side of the approximately flat surface. The display surface FS may correspond to a front surface of the display device EA and simultaneously may correspond to a front surface of the window WM. Hereinafter, the display surface FS of the display device EA and the front surface FS of the window WM will use the same reference numeral.

In this specification, the first directional axis DR1 and the second directional axis DR2 may be perpendicular to each other, and the third directional axis DR3 may be a normal direction with respect to the plane defined by the first directional axis DR1 and the second directional axis DR2. A thickness direction of the display device EA may be parallel to the third direction DR3. A top surface (or front surface) and a bottom surface (or rear surface) may oppose to each other in the third direction axis DR3, and the normal directions of the top surface (or front surface) and bottom surface (or rear surface) may be parallel to each other along the third direction axis DR3. The top surface (or upper side or upper portion) may refer to a surface that may be close to (or direction closer to) the display surface FS, and the bottom surface (or lower side or lower portion) may refer to a surface that may be spaced apart from (or faces away from) the display surface FS. A cross section may refer to a surface parallel to the thickness direction DR3, and a plane may refer to a surface perpendicular to the thickness direction DR3.

The plane may refer to a plane defined by the first direction axis DR1 and the second direction axis DR2.

The directions indicated as the first to third directional axes DR1, DR2, and DR3, which may be described in this specification, may be a relative concept and thus may be changed into different directions. Directions indicated by the first to third direction axes DR1, DR2, and DR3 may be described as first to third directions, and the same reference numerals may be used.

The display device EA according to an embodiment may sense an external input TC applied from an outside. The external input TC may include various types of input such as force, pressure, temperature, or light. In FIG. 1, the external input TC may be illustrated as a user's hand applied to the front surface of the display device EA. However, this may be illustrated as an example, and the external input TC may include an input applied close to the display device EA, such as a pen contact or hovering.

The display device EA may sense the user's input through the display surface FS defined on the front surface and may react to the sensed input signal. However, the area of the display device EA that senses the external input TC may not be limited to the front surface of the display device EA and may be changed depending on the design of the display device EA. For example, the display device EA may sense the user's input applied to the side or rear surface of the display device EA.

Referring to FIG. 2, the display device EA may include a window WM, a display module DM, an electronic module ELM, a power module PSM, and a housing HAU. The window WM and the housing HAU may extend to each other to define an outer appearance of the display device EA.

The window WM may be disposed on the display module DM. The window WM may cover a front surface IS of the display module DM and may protect the display module DM from external impact and scratches. The window WM may extend to the display module DM through an adhesive layer.

The window WM may include an optically transparent insulating material. For example, the window WM may include glass or a synthetic resin as a base film. The window WM may have a single-layered or multi-layered structure. For example, the multi-layered window WM may include synthetic resin films bonded with an adhesive or may include a glass film and a synthetic resin film bonded with an adhesive. The window WM may further include functional layers such as an anti-fingerprint layer, a phase control layer, a hard coating layer, etc., which may be disposed on an optically transparent base film.

The front surface FS of the window WM may correspond to the front surface of the display device EA. The front surface FS of the window WM may include a transmission area TA and a bezel area BZA.

The transmission area TA may be an optically transparent area. The transmission area TA may transmit the image IM provided by the display module DM. In FIGS. 1 and 2, the transmission area TA may be illustrated as a rectangular shape, but the transmission area TA may not be limited thereto and may have various shapes such as a circular shape or a polygonal shape.

The bezel area BZA may be an area having light transmittance less than that of the transmission area TA. The bezel area BZA may be an area on which a material having a color (e.g., predetermined or selectable color) may be printed. The bezel area BZA may prevent light from being transmitted to prevent a component of the display module DM disposed overlapping the bezel area BZA from being viewed from the outside. In this specification, the overlapping of a component and another component may not be limited to a case in which a component and the another component have a same area and a same shape, and also includes a case where a component and another component have different areas and/or different shapes.

The bezel area BZA may surround the transmission area TA. A shape of the transmission area TA may be substantially defined by the bezel area BZA. For example, the bezel area BZA may be disposed outside the transmission area TA to surround the transmission area TA. However, this may be an example, and the bezel area BZA may be adjacent to only a side of the transmissive area TA or may be disposed on the side surface rather than the front surface of the display device EA. The bezel area BZA may be omitted.

The display module DM may be disposed between the window WM and the housing HAU. The display module DM may display the image IM and sense the external input TC. The image IM may be displayed on the front surface IS of the display module DM. The front surface IS of the display module DM may include an active area AA and a peripheral area NAA.

The active area AA may be an area that may be activated according to an electrical signal. For example, the active area AA may have an area on which the image IM may be displayed, and also, the external input TC may be sensed. The active area AA may overlap at least a portion of the transmission area TA. Thus, the user may see the image IM through the transmission area TA or provide the external input TC. However, this may be merely an example. For example, an area of the active area AA on which the image IM may be displayed, and an area of the active area AA on which the external input TC may be sensed, may be separated from each other, but may not be limited to a specific embodiment.

The peripheral area NAA may be adjacent to the active area AA. For example, the peripheral area NAA may surround the active area AA. A driving circuit or a driving line for driving the active area AA may be disposed in the peripheral area NAA. The peripheral area NAA may overlap at least a portion of the bezel area BZA, and components disposed on the peripheral area NAA may be prevented from being viewed from the outside by the bezel area BZA.

The display module DM may include a display panel DP (see FIG. 3) and an input sensing layer ISP. The display panel DP (see FIG. 3) may display the image IM, and the input sensing layer ISP (see FIG. 3) may sense the external input TC. This will be described later in detail.

A portion of the display module DM may be bent based on a bending axis extending in the first direction DR1. The portion of the display module DM may be bent toward the rear surface of the display module DM to overlap the active area AA. A flexible circuit board FCB may be electrically connected to a portion of the bent display module DM. Thus, in the state in which the display module DM may be bent, the flexible circuit board FCB may overlap the display module DM in a plan view.

The flexible circuit board FCB may be disposed on a side of the display module DM and electrically connected to the display module DM. The flexible circuit board FCB may generate an electrical signal provided to the display module DM, or may receive a signal generated by the display module DM to calculate result values including a position at which the external input TC may be sensed or intensity information.

The display device EA may further include the electronic module ELM and the power module PSM. The electronic module ELM and the power module PSM may be disposed below the display module DM. The electronic module ELM and the power module PSM may be electrically connected through a separate circuit board.

The power module PSM may supply power that may be desirable for an operation of the display device EA. For example, the power module PSM may include a typical battery module.

The electronic module ELM may include various functional modules that operate the display device EA. For example, the electronic module ELM may include a control module, a wireless communication module, an image input module, an audio input module, an audio output module, a memory, an optical module, and an external interface module. The electronic module ELM may include a main circuit board, and the modules of the electronic module ELM may be mounted on the main circuit board or may be electrically connected to the main circuit board through a separate circuit board.

In the electronic modules ELM, the control module may control an overall operation of the display device EA. For example, the control module may activate or deactivate the display module DM according to the user input. The control module may include at least one microprocessor. In the electronic modules ELM, the optical module may include a camera module, a proximity sensor, a biometric sensor that recognizes a portion of the user's body (e.g., fingerprint, iris, or face), or a lamp that outputs light.

The housing HAU may extend to the window WM to provide an inner space for accommodating the display module DM, the electronic module ELM, the power module PSM, and the flexible circuit board FCB. The housing HAU may include a material having relatively high rigidity. For example, the housing HAU may include glass, plastic, or a metal or may include multiple frames and/or plates made of a combination of glass, plastic, and a metal. The housing HAU may protect the components of the display device EA by absorbing an impact applied from the outside or preventing foreign material/moisture from being permeated from the outside.

Figure 3:
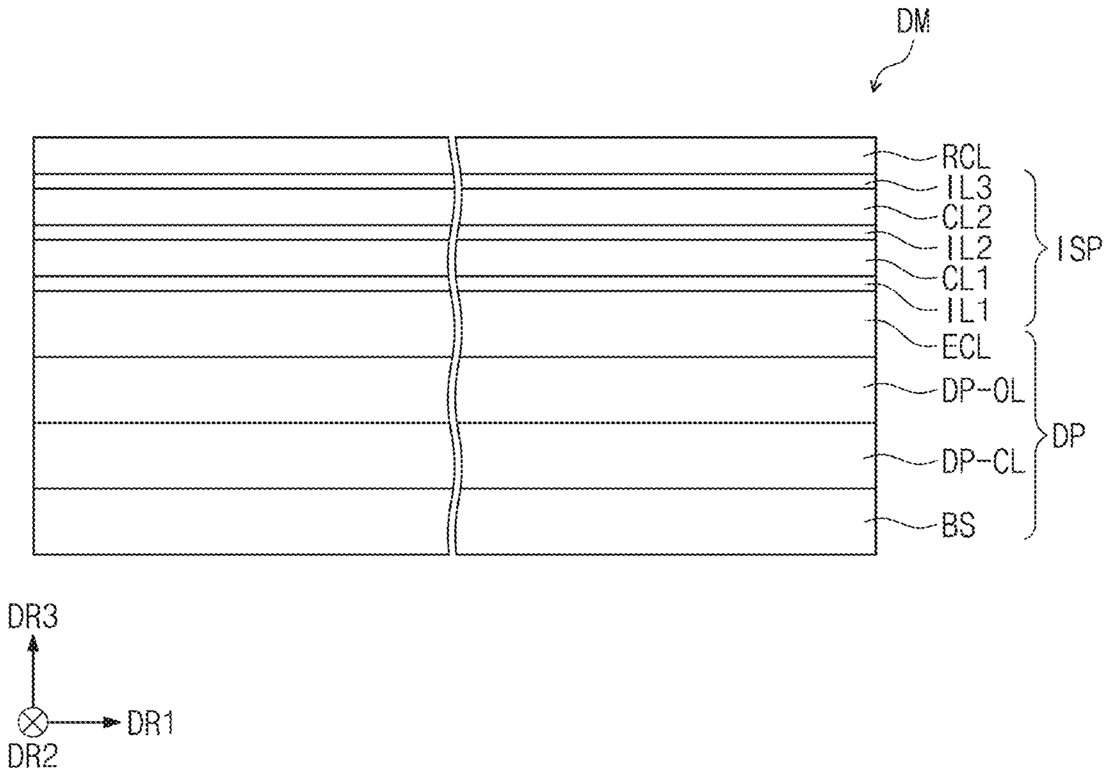
FIG. 3 is a schematic cross-sectional view illustrating a portion of the display device according to an embodiment.

FIG. 3 is a schematic cross-sectional view of the display module DM according to an embodiment. Referring to FIG. 3, the display module DM may include a display panel DP, an input sensing layer ISP, and an optical layer RCL, which may be sequentially laminated.

The display panel DP may display an image according to an electrical signal. The display panel DP according to an embodiment of the inventive concept may be an emission type display panel, but may not be limited thereto. For example, the display panel DP may be an organic light emitting display panel, an inorganic light emitting display panel, a quantum dot light emitting display panel, a micro LED display panel, or a nano LED display panel. The display panel DP may include a base layer BS, a circuit layer DP-CL, a display element layer DP-OL, and an encapsulation layer ECL, which may be sequentially laminated in the third direction DR3.

The base layer BS may be a rigid substrate or a flexible substrate capable of being bent, folded, or rolled. For example, the base layer BS may be a glass substrate, a metal substrate, or a polymer substrate. However, the embodiment of the inventive concept may not be limited thereto. For example, the base layer BS may include an inorganic layer, an organic layer, or a composite layer. The base substrate BS may provide a base surface on which the circuit layer DP-CL may be disposed.

The base layer BS may include a single layer or multiple layers. For example, the base layer BS may include a first synthetic resin layer, a multilayer or single inorganic layer, and a second synthetic resin layer disposed above the multilayer or single inorganic layer. Each of the first synthetic resin layer and the second synthetic resin layer may include a polyimide-based resin. Also, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the "[chemical name]-based" resin means including a functional group of the chemical name.

The circuit layer DP-CL may be disposed on the base layer BS. The circuit layer DP-CL may include at least one insulating layer, a conductive pattern, and a semiconductor pattern. The insulating layer, the semiconductor pattern, and the conductive pattern included in the circuit layer DP-CL may form driving elements such as transistors, signal lines, and pads.

The display element layer DP-OL may be disposed on the circuit layer DP-CL. The display element layer DP-OL may include light emitting elements that emit light. For example, the light emitting elements may include organic light emitting elements, inorganic light emitting elements, quantum dot light emitting elements, micro LEDs, nano LEDs, etc. The light emitting elements of the display element layer DP-OL may be electrically connected to the driving elements of the circuit layer DP-CL to emit light according to electrical signals provided by the driving elements.

The encapsulation layer ECL may be disposed on the display element layer DP-OL to seal the light emitting elements. The encapsulation layer ECL may include at least one thin film to improve optical efficiency of the display element layer DP-OL or to protect the display element layer DP-OL. For example, the encapsulation layer ECL may include at least one of an inorganic layer or an organic layer. The inorganic layer of the encapsulation layer ECL may protect the light emitting element from the moisture/oxygen. The organic layer of the encapsulation layer ECL may protect the light emitting element from the foreign material such as dust particles.

The input sensing layer ISP may be disposed (e.g., directly disposed) on the display panel DP. The input sensing layer ISP may be formed on the display panel DP through a continuous process, and thus, the input sensing layer ISP and the display panel DP may extend to each other without a separate adhesive layer. The components of the input sensing layer ISP may be disposed on the base surface provided by the display panel DP.

In this specification, that a component may be disposed/formed (e.g., directly disposed/formed) on another component means that a third component may not be disposed/formed between a component and another component. In case that a component may be "directly disposed/formed" on another component, it means that a component may be "in contact with" another component.

The input sensing layer ISP may sense the external input to provide an input signal including information about the external input so that the display panel DP displays an image corresponding to the external input. The input sensing layer ISP may be driven in various manners, such as a capacitive manner, a resistive manner, an infrared manner, an acoustic manner, or a pressure manner, and the driving method of the input sensing layer ISP may not be limited to any one as long as the external input may be sensed through the driving manner. Hereinafter, the input sensing layer ISP will be described as being driven in the capacitive manner.

The input sensing layer ISP may include a base insulating layer IL1, a first sensing conductive layer CL1, a first sensing insulating layer IL2, a second sensing conductive layer CL2, and a second sensing insulating layer IL3. The base insulating layer IL1 of the input sensing layer ISP may be in contact with the encapsulation layer ECL. However, the embodiment may not be limited to this, and at least one of the base insulating layer IL1 or the second sensing insulating layer IL3 may be omitted.

Each of the first sensing conductive layer CL1 and the second sensing conductive layer CL2 may include a conductive pattern layer having a single layer or multilayer structure. The multilayered conductive pattern layer may include at least two of transparent conductive layers and metal layers. The conductive pattern layer having the multilayered structure may include metal layers including metals different from each other. The transparent conductive layer may include at least one of indium tin oxide (ITO), indium zinc oxide (IZO), zinc oxide (ZnO), or indium tin zinc oxide (ITZO), PEDOT, a metal nano wire, or graphene. The metal layer may include at least one of molybdenum (Mo), silver (Ag), titanium (Ti), copper (Cu), aluminum (Al), or an alloy thereof. For example, each of the first sensing conductive layer CL1 and the second sensing conductive layer CL2 may have a two-layered structure, for example, ITO/Cu, but may not be limited thereto. For example, a three-layered structure of titanium/aluminum/titanium may be provided.

Each of the first sensing conductive layer CL1 and the second sensing conductive layer CL2 may include sensing conductive patterns. The sensing conductive patterns of the first sensing conductive layer CL1 and the second sensing conductive layer CL2 may provide sensing electrodes constituting the input sensing layer ISP and sensing lines electrically connected thereto.

Each of the base insulating layer IL1, the first sensing insulating layer IL2, and the second sensing insulating layer IL3 may include at least one of an inorganic layer or an organic layer. For example, the inorganic layer may include at least one of aluminum oxide, titanium oxide, silicon oxide, silicon oxynitride, zirconium oxide, or hafnium oxide, and the organic layer may include at least one of an acrylic resin, a methacrylic resin, polyisoprene, a vinyl resin, an epoxy-based resin, a urethane-based resin, a cellulose-based resin, a siloxane-based resin, a polyimide-based resin, a polyamide-based resin, or a perylene-based resin. However, this may be an example, and the materials of the inorganic layer and organic layer may not be limited thereto. The base insulating layer IL1 may include an inorganic layer, and each of the first and second sensing insulating layers IL2 and IL3 may include an organic layer, but the embodiment may not be limited thereto.

The optical layer RCL may be disposed on the input sensing layer ISP. The optical layer RCL may include a pigment or a dye. The optical layer RCL may be a layer that selectively transmits light emitted from the display panel DP. The optical layer RCL may be a layer that reduces reflectance of external light incident from the outside.

Figure 4:
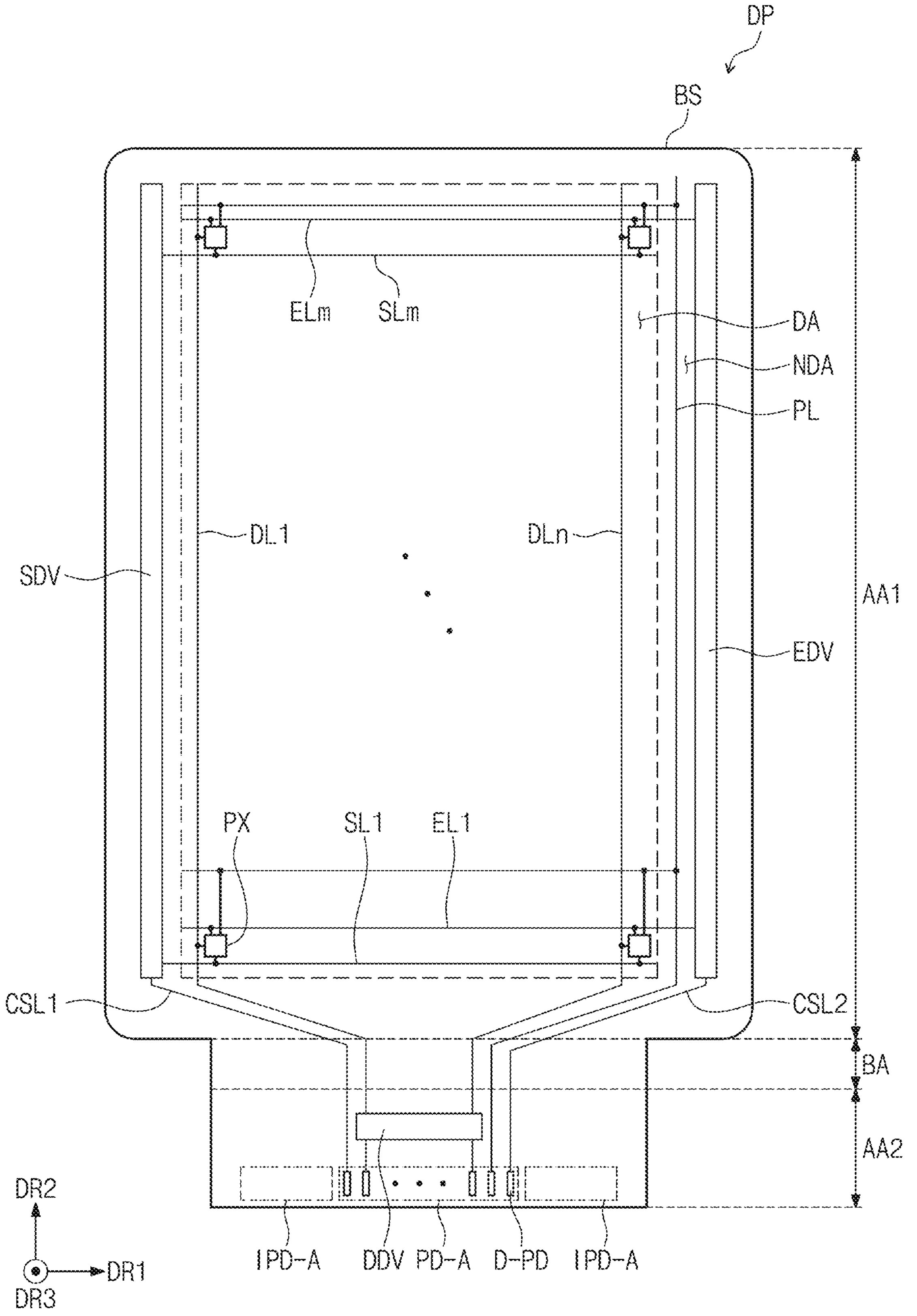
FIG. 4 is a plan view illustrating a portion of the display device according to an embodiment.

FIG. 4 is a plan view of the display panel DP according to an embodiment. Referring to FIG. 4, the display panel DP may include a base layer BS, pixels PX, signal lines SL1 to SLm, DL1 to DLn, EL1 to ELm, CSL1, CSL2, and PL electrically connected to the pixels PX, a scan driver SDV, an emission driver EDV, a driver chip (data driver) DDV, and display pads D-PD.

The base layer BS may provide a base surface on which electrical elements, lines, etc. of the display panel DP may be disposed. The base layer BS may include a first base area AA1, a bending area BA, and a second base area AA2, which may be distinguished from each other in the second direction DR2. The bending area BA may extend from the second base area AA2 in the second direction DR2. The first base area AA1 may extend from the bending area BA in the second direction DR2. The first base area AA1 and the second base area AA2 may be spaced apart from each other with the bending area BA therebetween.

The first base area AA1 may include the display area DA. The display area DA may be an area on which the light emitting elements of the pixels PX may be disposed. Thus, the pixels PX may display an image through the display area DA. The display area DA may correspond to the active area AA (see FIG. 2) of the display module DM (see FIG. 2) and may overlap the transparent area TA (see FIG. 2).

The remaining first base area AA1 excluding the second base area AA2, the bending area BA, and the display area DA may be defined as the non-display area NDA. The non-display area NDA may be adjacent to the display area DA and may be an area on which an image may not be displayed. The non-display area NDA may surround the display area DA. The scan driver SDV, the emission driver EDV, the driver chip DDV, which may be configured to drive the pixels PX, and the display pads D-PD electrically connected to the signal lines SL1 to SLm, DL1 to DLn, EL1 to ELm, CSL1, CSL2, and PL may be disposed on non-display area NDA. The signal lines SL1 to SLm, DL1 to DLn, EL1 to ELm, CSL1, CSL2, and PL electrically connected to the pixels PX may extend and be disposed on the non-display area NDA.

The bending area BA may be an area bent around a bending axis extending in the first direction DR1. The bending area BA may be bent toward the rear surface of the display panel DP corresponding to the first base area AA1. The second base area AA2 extending from one side of the bending area BA due to the bending of the bending area BA may overlap the first base area AA1 in a plan view. In case that the display panel DP is bent, the second base area AA2 may be disposed on the rear surface of the display panel DP corresponding to the first base area AA1.

In the first direction DR1, a width of each of the bending area BA and the second base area AA2 may be less than that of the first base area AA1. Since the bending area BA has a width less than that of the first base area AA1 in the direction parallel to the direction in which the bending axis extends, the bending area BA may be readily bent. However, this may be an example, and at least one of the widths of the bending area BA and the second base area AA2 in the first direction DR1 and the width of the first base area AA1 may be a same, but may not be limited thereto.

The second base area AA2 may be an approximately flat area disposed below the first base area AA1 by bending the bending area BA. The second base area AA2 may be an area on which the signal lines, which extend toward the display pads D-PD via the bending area BA from the first base area AA1 among the signal lines SL1 to SLm, DL1 to DLn, EL1 to ELm, CSL1, CSL2, and PL, and the driving chip DDV may be disposed.

The area on which the display pads D-PD may be disposed and the area on which the sensing pads I-PD (see FIG. 5), which will be described later, may be disposed, respectively, may be divided into the display pad area PD-A and the sensing pad area IPD-A. In FIG. 4, the display pad area PD-A and the sensing pad area IPD-A may be illustrated as being divided in the first direction DR1. For example, the sensing pad area IPD-A may be provided adjacent to both sides of the second base area AA2 in the first direction DR1, and the display pad area PD-A may be provided at a central portion adjacent to a lower end of the second base area AA2. However, the embodiment may not be limited thereto, and the arrangement positions of the display pads D-PD and the sensing pads I-PD (see FIG. 5)) may be changed in various manners.

Figure 5:
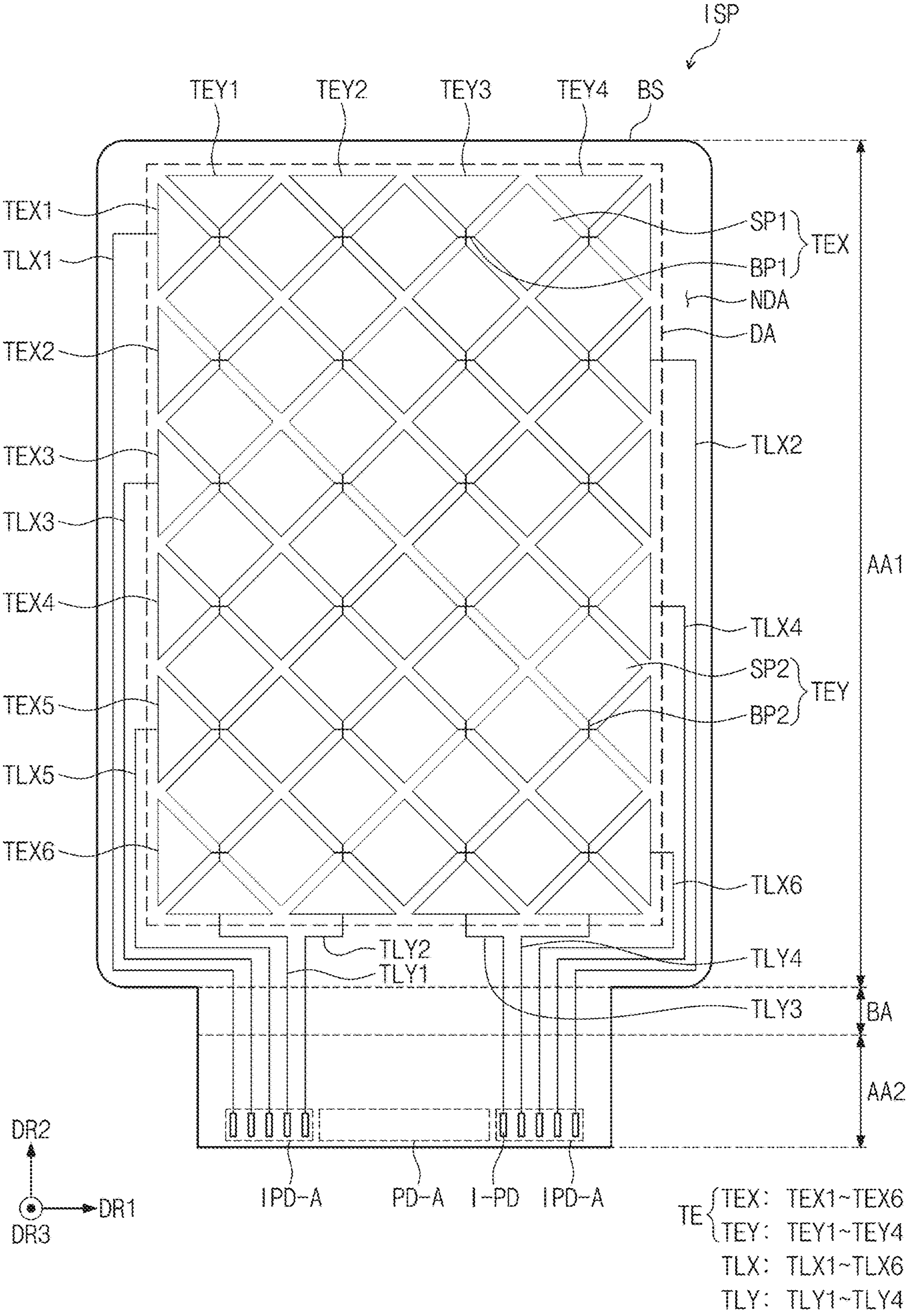
FIG. 5 is a plan view illustrating a portion of the display device according to an embodiment.

The flexible circuit board FCB (see FIG. 2) may be disposed on the second base area AA2, on which the display pads D-PD and the sensing pads I-PD (see FIG. 5) may be disposed, and be electrically connected to the display pads D-PD and the sensing pads I-PD (see FIG. 5). The flexible circuit board FCB (see FIG. 2) disposed adjacent to a lower end of the second base area AA2 may be disposed on the rear surface of the display panel DP by bending the bending area BA. As the second base area AA2 and the flexible circuit board FCB (see FIG. 2) may be disposed below the first base area AA1 of the display device EA (see FIG. 2), a surface area of the bezel of the display device EA (see FIG. 2) may be reduced.

Each of the pixels PX may include a pixel driving circuit constituted by transistors (e.g., a switching transistor, a driving transistor, etc.) and at least one capacitor, and the light emitting element electrically connected to the pixel driving circuit. The pixels PX may generate light in response to an electrical signal applied to each of the pixels PX and may display an image through the display area DA. A portion of the pixels PX may include a transistor disposed on the non-display area NDA, but may not be limited to any one embodiment.

The scan driver SDV and the emission driver EDV may be disposed on the non-display area NDA corresponding to the first base area AA1. The driving chip DDV may be disposed on the non-display area NDA corresponding to the second base area AA2. The driving chip DDV may be provided in the form of an integrated circuit chip mounted on the non-display area NDA of the display panel DP. However, the embodiment may not be limited thereto, and the driving chip DDV may be mounted on a flexible circuit board FCB (see FIG. 2).

The signal lines SL1-SLm, DL1-DLn, EL1-ELm, CSL1, CSL2, and PL may include scan lines SL1 to SLm, data lines DL1 to DLn, emission lines EL1 to ELm, first and second control lines CSL1 and CSL2, and a power line PL. Here, m and n may be natural numbers.

The data lines DL1 to DLn may be insulated from and cross the scan lines SL1 to SLm and the emission lines EL1 to ELm. For example, the scan lines SL1 to SLm may extend in the first direction DR1 and be electrically connected to the scan driver SDV. The data lines DL1 to DLn may extend in the second direction DR2 and may be electrically connected to the driving chip DDV. The emission lines EL1 to ELm may extend in the first direction DR1 and be electrically connected to the emission driver EDV.

The first power line PL1 may include a portion extending in the first direction DR1 and a portion extending in the second direction DR2. A portion of the power line PL extending in the first direction DR1 and a portion of the power line PL extending in the second direction DR2 may be disposed on different layers or may be disposed on a same layer and may be integral with each other. The portion of the power line PL extending in the first direction DR1 may be electrically connected to the pixels PX and the portion of the power line PL extending in the second direction DR2. The portion of the power line PL extending in the second direction DR2 may be disposed on the non-display area NDA and electrically connected to the display pads D-PD via the bending area BA and the second base area AA2 from the first base area AA1. The power line PL1 may provide a first voltage to the pixels PX.

The first control line CSL1 may be electrically connected to the scan driver SDV and extend toward the lower end of the second base area AA2 via the bending area BA. The second control line CSL2 may be electrically connected to the emission driver EDV and extend toward the lower end of the second base area AA2 via the bending area BA.

The display pads D-PD may be disposed adjacent to a lower end of the second base area AA2. On the second base area AA2, the display pads D-PD may be disposed closer to the lower end of the base layer BS than to the driving chip DDV. The display pads D-PD may be arranged to be spaced apart from each other along the first direction DR1. Each of the power line PL, the first control line CSL1, and the second control line CSL2 may be electrically connected to a corresponding display pad D-PD of the display pads D-PD. Each of the data lines DL1 to DLn may be electrically connected to a corresponding display pad D-PD of the display pads D-PD through the driving chip DDV.

The display pads D-PD may be electrically connected to the flexible circuit board FCB (see FIG. 2) through an anisotropic conductive adhesive layer, and the electrical signal provided from the flexible circuit board FCB (see FIG. 2) may be transmitted to the display panel DP through the display pads D-PD. However, the connection method between the display pads D-PD and the flexible circuit board FCB (see FIG. 2) may not be limited thereto.

The scan driver SDV may generate scan signals in response to scan control signals. The scan signals may be applied to the pixels PX through the scan lines SL1 to SLm. The driving chip DDV may generate data voltages corresponding to image signals in response to a data control signal. The data voltages may be provided to the pixels PX through the data lines DL1 to DLn. The emission driver EDV may generate emission signals in response to emission signals. The emission signals may be applied to the pixels PX through the emission lines EL1 to ELm.

The pixels PX may receive the data voltages in response to the scan signals. The pixels PX may emit light having a luminance corresponding the data voltages in response to the emission signals to generate an image. An emission time of the pixels PX may be controlled by the emission signals.

FIG. 5 is a plan view of the input sensing layer ISP according to an embodiment of the inventive concept. FIG. 5 briefly illustrates constituents of the input sensing layer ISP disposed on the base layer BS described above for convenience of explanation.

For example, the input sensing layer ISP may be driven in a mutual-capacitance manner. Referring to FIG. 5, the input sensing layer ISP includes first sensing electrodes TEX (TEX1 to TEX6), second sensing electrodes TEY (TEY1 to TEY4), first sensing lines TLX (TLX1 to TLX6), second sensing lines TLY (TLY1 to TLY4), and sensing pads I-PD. However, the embodiment may not be limited to this, and the input sensing layer ISP may be driven in a self-capacitance manner.

Each of the first sensing electrodes TEX may extend in the first direction DR1, and the first sensing electrodes TEX may be arranged in the second direction DR2. Although six first sensing electrodes TEX1 to TEX6 may be illustrated as an example in FIG. 5, the number of first sensing electrodes TEX included in the input sensing layer ISP may not be limited thereto. One first sensing electrode TEX may include first sensing patterns SP1 arranged along the first direction DR1 and first connection patterns BP1 connecting the first sensing patterns SP1.

Each of the second sensing electrodes TEY may extend in the second direction DR2, and the second sensing electrodes TEY may be arranged in the first direction DR1. Although four second sensing electrodes TEY1 to TEY4 may be illustrated as an example in FIG. 5, the number of second sensing electrodes TEY included in the input sensing layer ISP may not be limited thereto. One second sensing electrode TEY may include second sensing patterns SP2 arranged along the second direction DR2 and second connection patterns BP2 connecting the second sensing patterns SP2.

The first sensing electrodes TEX and the second sensing electrodes TEY may be electrically insulated from each other. The input sensing layer ISP may sense an external input through a change in capacitance between the first sensing electrodes TEX and the second sensing electrodes TEY. The first sensing electrodes TEX and the second sensing electrodes TEY may be disposed on an area corresponding to the display area DA (see FIG. 4) of the base layer BS. Thus, the display device EA (see FIG. 2) may display an image through the display area DA (see FIG. 4) and simultaneously sense an external input applied to the display area DA (see FIG. 4).

The first sensing lines TLX1 to TLX6 may be disposed on the non-display area NDA (see FIG. 4) and electrically connected to the first sensing electrodes TEX1 to TEX6, respectively. Some of the first sensing lines TLX1 to TLX6 may be disposed at a left side of the non-display area NDA, and some of the first sensing lines may be disposed at a right side of the non-display area NDA. For example, the first sensing lines TLX1, TLX3, and TLX5 electrically connected to the first sensing electrodes TEX1, TEX3, and TEX5 arranged in odd rows may be electrically connected to left sides of the first sensing electrodes TEX1, TEX3, and TEX5, respectively, and the first sensing lines TLX2, TLX4, and TLX6 electrically connected to the first sensing electrodes TEX2, TEX4, and TEX6 arranged in even rows may be electrically connected to right sides of the first sensing electrodes TEX2, TEX4, and TEX6, respectively. However, the arrangement of the first sensing lines TLX1 to TLX6 may not be limited thereto, and all the first sensing lines TLX1 to TLX6 may be disposed at the left side of the non-display area NDA, or all the first sensing lines TLX1 to TLX6 may be disposed at the left side of the non-display area NDA.

Each of the first sensing lines TLX1 to TLX6 may extend from the first base area AA1 to the second base area AA2 via the bending area BA. The first sensing lines TLX1 to TLX6 may be electrically connected to the sensing pads I-PD disposed on the second base area AA2, respectively.

The second sensing lines TLY1 to TLY4 may be disposed on the non-display area NDA (see FIG. 4) and electrically connected to the second sensing electrodes TEY1 to TEY4, respectively. Some of the second sensing lines TLY1 to TLY4 may be disposed adjacent to the left side of the non-display area NDA (see FIG. 4), and the remaining portion may be disposed adjacent to the right side of the non-display area NDA (see FIG. 4). For example, the second sensing lines TLY1 and TLY2 electrically connected to the second sensing electrodes TEY1 and TEY2 disposed at the left sides of the second sensing electrodes TEY1 to TEY4 in the first direction DR1 may be disposed adjacent to the left sides of the first base area AA1, and the second sensing lines TLY3 and TLY4 electrically connected to the second sensing electrodes TEY3 and TEY4 disposed at the right sides of the first base area AA1 may be disposed adjacent to the right side of the area AA1. However, the arrangement of the second sensing lines TLY1 to TLY4 may not be limited thereto.

Each of the second sensing lines TLY1 to TLY4 may extend from an area adjacent to the lower end of the first base area AA1 toward the second base area AA2 via the bending area BA. The second sensing lines TLY1 to TLY4 may be electrically connected to the sensing pads I-PD disposed on the second base area AA2, respectively.

Some of the sensing pads I-PD may be disposed on an area adjacent to the left side of the second base area AA2 in the first direction DR1, and the remaining portions may be disposed on an area adjacent to the right side of the second base area AA2. For example, the sensing pads I-PD may be divided into two groups spaced apart from each other with the display pad area PD-A therebetween. However, the arrangement of the sensing pads I-PD may not be limited to this.

The sensing pads I-PD and the display pads D-PD may be disposed on a same layer (see FIG. 4). The sensing pads I-PD may be disposed on a different layer from the first and second sensing lines TLX1 to TLX6 and TLY1 to TLY4 and may be electrically connected through a contact hole. However, the embodiment may not be limited thereto, and the sensing pads I-PD may be disposed on a different layer from the display pads D-PD (see FIG. 4). For example, the sensing pads I-PD and the first and second sensing lines TLX1 to TLX6 and TLY1 to TLY4 may be integral with each other and may be disposed on a same layer.

The first and second sensing lines TLX1 to TLX6 and TLY1 to TLY4 may be disposed above components of the display panel DP (see FIG. 4) on an area corresponding to the non-display area NDA (see FIG. 4) of the base layer BS. Thus, the first and second sensing lines TLX1 to TLX6 and TLY1 to TLY4 may overlap the components of the display panel DP (see FIG. 4) on the bending area BA and the second base area AA2.

Figure 6:
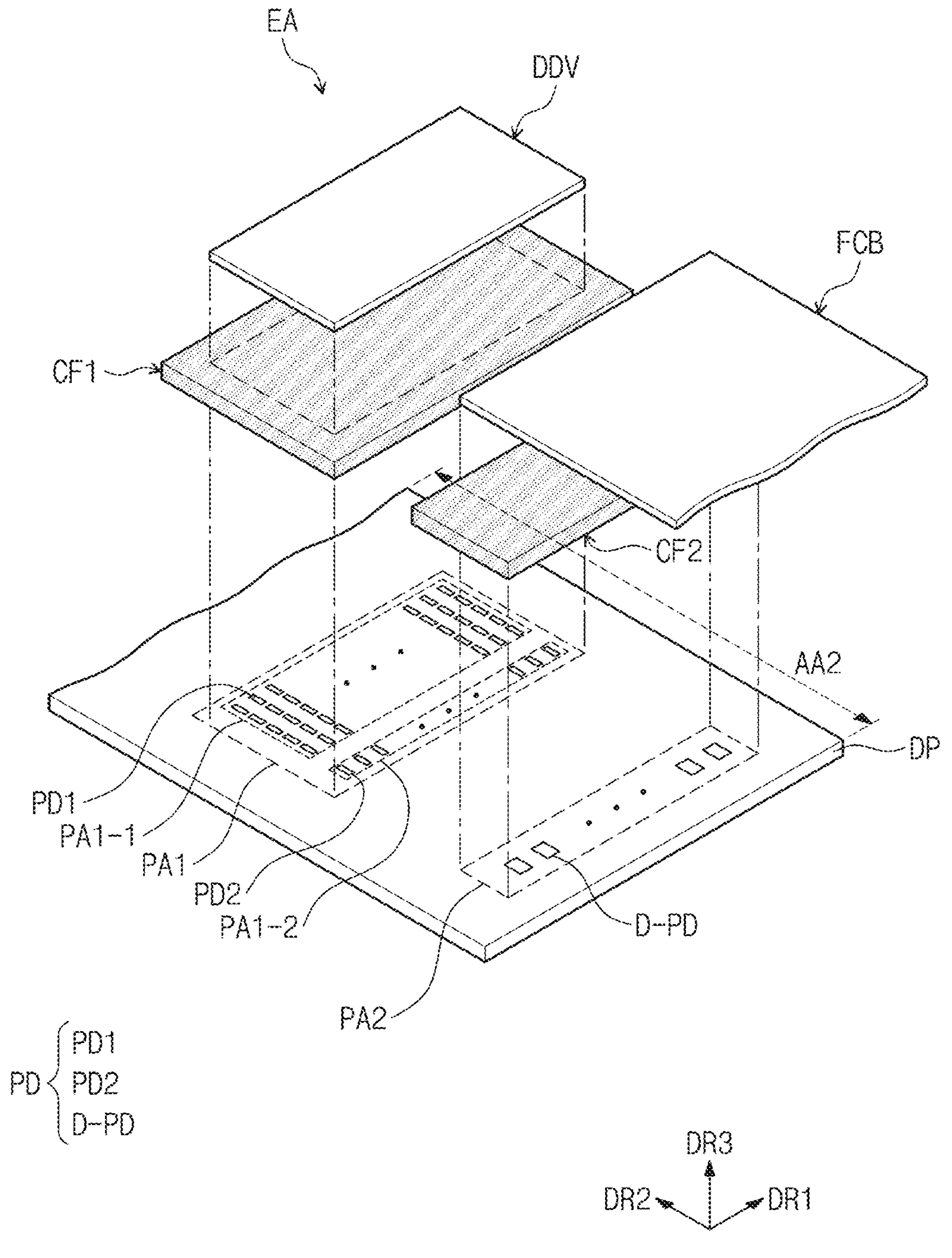
FIG. 6 is a perspective view illustrating a portion of the display device according to an embodiment.

FIG. 6 is a perspective view of the display device EA according to an embodiment. FIG. 6 briefly illustrates some components of the display device EA disposed corresponding to the second base area AA2.

The second base area AA2 may correspond to a portion of the non-display area NDA (see FIG. 4). As illustrated in FIG. 6, in the second base area AA2, an area on which the driving chip DDV may be bonded may be defined as a first pad area PA1, and an area on which the flexible circuit board FCB may be bonded may be defined as a second pad area PA2.

The driving chip DDV may be bonded to the first pad area PA1 through the first conductive adhesive layer CF1, and the flexible circuit board FCB may be bonded to the second pad area PA2 through the second conductive adhesive layer CF2. Each of the first conductive adhesive layer CF1 and the second conductive adhesive layer CF2 may be provided as an anisotropic conductive adhesive. For example, each of the first conductive adhesive layer CF1 and the second conductive adhesive layer CF2 may include an adhesive resin and conductive particles dispersed in the adhesive resin.

As another example, at least one of the first conductive adhesive layer CF1 and the second conductive adhesive layer CF2 may be omitted. For example, the driving chip DDV and the flexible circuit board FCB may be ultrasonic bonded to the first pad area PA1 and the second pad area PA2, respectively.

The display panel DP may include multiple pads PD. The pads PD may include first signal pads PD1, second signal pads PD2, and display pads D-PD. The first signal pads PD1, the second signal pads PD2, and the display pads D-PD may be pads disposed in a signal transmission path.

The first signal pads PD1 may be disposed to correspond to an output bump of the driving chip DDV and may be input pads that receive signals from the driving chip DDV. The second signal pads PD2 may be disposed to correspond to an input bump of the driving chip DDV and may be output pads that transmit signals to the driving chip DDV. The display pads D-PD may be panel input pads that receive signals from the flexible circuit board FCB.

Each of the first signal pads PD1 may be electrically connected to the pixels PX (see FIG. 4) of the display panel DP through a signal line and may transmit and receive signals to the pixels PX (see FIG. 4). Each of the second signal pads PD2 may be electrically connected to a corresponding display pad D-PD through a signal line, and the display pads D-PD and the second signal pads PD2, which may be electrically connected to each other, may transmit and receive signals.

The first pad area PA1 may include a first sub pad area PA1-1 and a second sub pad area PA1-2. The first sub pad area PA1-1 may be defined as an area on which the first signal pads PD1 may be disposed. The second sub pad area PA1-2 may be defined as an area on which the second signal pads PD2 may be disposed.

The first signal pads PD1 may be arranged along the first direction DR1 and the second direction DR2 in the first sub pad area PA1-1. In the first signal pads PD1, the first signal pads PD1 arranged along the second direction DR2 may be defined as a pad row. FIG. 6 illustrates an example in which five pad rows may be arranged along the second direction DR2. The arrangement of the first signal pads PD1 may not be limited to any one arrangement as long as at least two or more pad rows may be arranged along the second direction DR2.

The second signal pads PD2 may be arranged along the first direction DR1 in the second sub pad area PA1-2. The second signal pads PD2 may be arranged in one pad row. However, the arrangement of the second signal pads PD2 may not be limited thereto.

Figure 7A:
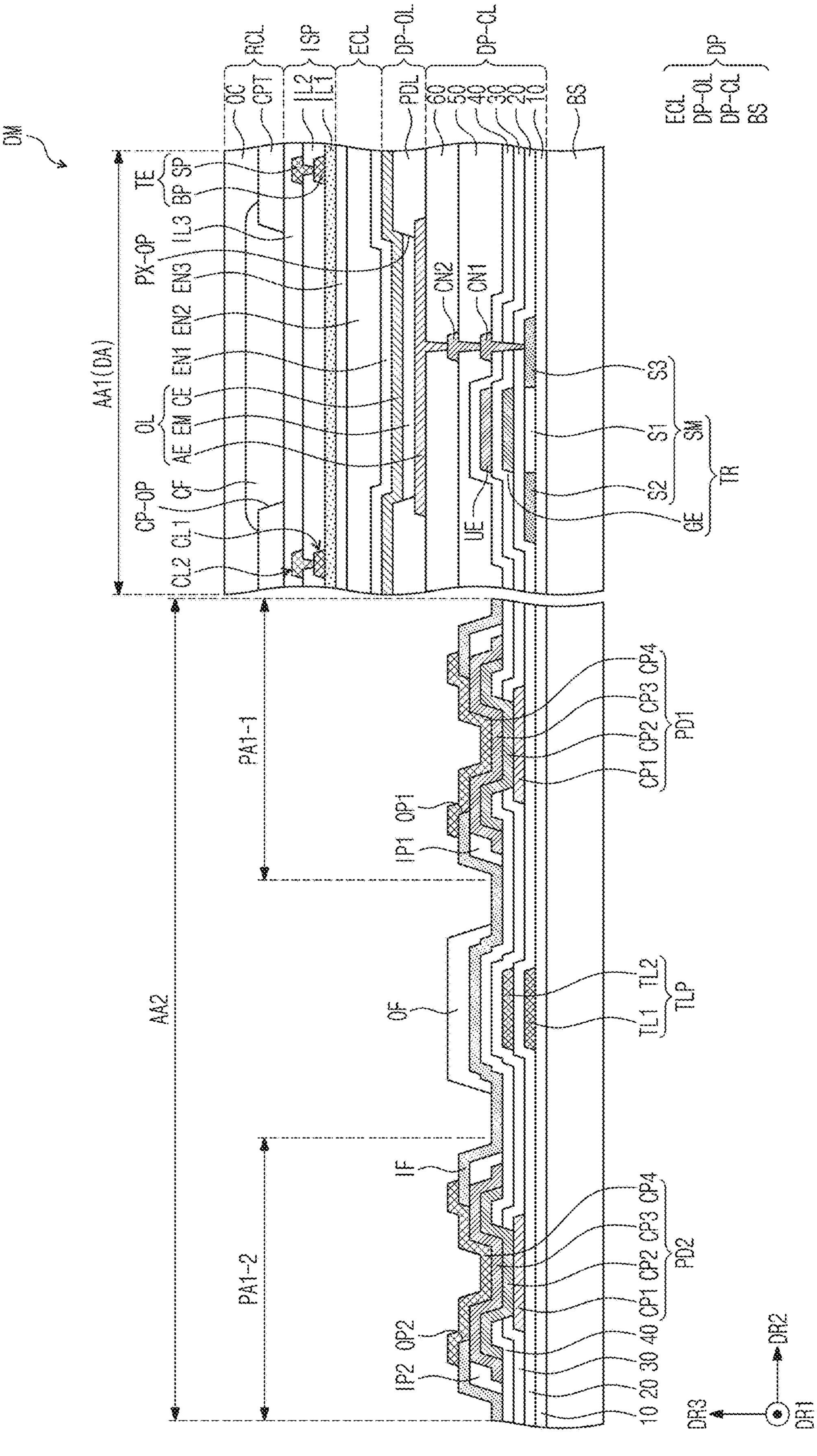
FIG. 7A is a schematic cross-sectional view illustrating a portion of the display device according to an embodiment.

FIG. 7A is a schematic cross-sectional view of the display module DM according to an embodiment. FIG. 7A illustrates a schematic cross-section corresponding to the first base area AA1 and the second base area AA2 of FIG. 4.

The base layer BS may have insulating properties and may provide a base surface on which components of the display module DM may be disposed. The base layer BS may have ductility to enable bending. As described above, the base layer BS may include a first base area AA1, a bending area BA (see FIG. 4), and a second base area AA2, and the bending area BA (see FIG. 4) of the base layer BS may be bent to a curvature (e.g., predetermined or selectable curvature).

The circuit layer DP-CL may include insulating layers 10 to 60 disposed on the base layer BS, a transistor TR of the pixel PX (see FIG. 4), an upper electrode UE, and connection electrodes CN1 and CN2. The insulating layers 10 to 60 may include first to sixth insulating layers 10 to 60 sequentially laminated on the base layer BS along the thickness direction. However, the embodiment of the insulating layers 10 to 60 included in the circuit layer DP-CL may not be limited thereto and may be changed depending on the configuration or manufacturing process of the circuit layer DP-CL.

The first insulating layer 10 may be disposed on the base layer BS. The first insulating layer 10 may serve as a barrier layer and/or a buffer layer that prevents foreign material from being introduced from the outside. The first insulating layer 10 may improve bonding strength between the base layer BS and the semiconductor pattern SM and/or the conductive pattern of the circuit layer DP-CL. The first insulating layer 10 may include at least one of a silicon oxide layer or a silicon nitride layer. For example, the first insulating layer 10 may include multiple silicon oxide layers and multiple silicon nitride layers, which may be alternately laminated.

The pixel PX (see FIG. 4) may be disposed on the base layer BS. The pixel PX (see FIG. 4) may be arranged to correspond to the display area DA of the first base area AA1. The pixel PX (see FIG. 4) may include a transistor TR and a light emitting element OL.

The transistor TR may include a semiconductor pattern SM and a gate GE. The semiconductor pattern SM may be disposed on the first insulating layer 10. The semiconductor pattern SM may include a channel S1, a source S2, and a drain S3. The semiconductor pattern SM may include a silicon semiconductor, for example, a single-crystal silicon semiconductor, a poly-silicon semiconductor, or an amorphous silicon semiconductor. As another example, the semiconductor pattern SM may include an oxide semiconductor. The semiconductor pattern SM may be made of various materials as long as the semiconductor pattern SM has semiconductor properties, but may not be limited to a specific embodiment.

The semiconductor pattern SM may include multiple regions with different electrical properties depending on whether the semiconductor pattern SM may be doped or reduced. For example, the semiconductor pattern SM may include a region with high conductivity due to doping or reduction of metal oxide, and the region with high conductivity may serve as an electrode or signal line of the transistor TR. This may correspond to the source S2 and drain S3 of the transistor TR. The semiconductor pattern SM may include an undoped region with relatively low conductivity, which may correspond to the channel S1 (or active area) of the transistor TR.

The second insulating layer 20 may be disposed on the first insulating layer 10 to cover the semiconductor pattern SM. The gate GE may be disposed on the second insulating layer 20. The second insulating layer 20 may be disposed between the semiconductor pattern SM and the gate GE of the transistor TR. The gate GE may overlap the channel S1 of the semiconductor pattern SM in a plan view. The gate GE may function as a mask in a process of doping the semiconductor pattern SM. The gate GE may include heat-resistant molybdenum (Mo), an alloy containing molybdenum, titanium (Ti), an alloy containing titanium, etc., but may not be limited thereto.

The structure of the transistor TR illustrated in FIG. 7A may be an example, and the source S2 and drain S3 of the transistor TR may be electrodes formed independently from the semiconductor pattern SM. In this case, the source S2 and drain S3 may be in contact with the semiconductor pattern SM or may be electrically connected to the semiconductor pattern SM through an insulating layer. The gate GE may be disposed below the semiconductor pattern SM. The transistor TR may be formed in various structures and may not be limited to any one embodiment.

The second insulating layer 20 and the third to sixth insulating layers 30 to 60 to be described later may include at least one of an inorganic layer or an organic layer. For example, the inorganic layer may include at least one of oxide, titanium oxide, silicon oxide, silicon oxynitride, zirconium oxide, or hafnium oxide. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin.

The third insulating layer 30 may be disposed on the second insulating layer 20 to cover the gate GE. An upper electrode UE may be disposed on the third insulating layer 30. The upper electrode UE may overlap the gate GE in a plan view, and the gate GE and the upper electrode UE that overlap each other may form a capacitor.

The fourth insulation layer 40 may be disposed on the third insulation layer 30 to cover the upper electrode UE. The connection electrodes CN1 and CN2 may include a first connection electrode CN1 and a second connection electrode CN2. The first connection electrode CN1 may be disposed on the fourth insulating layer 40. A fifth insulating layer 50 may be disposed on the fourth insulating layer 40 to cover the first connection electrode CN1. The second connection electrode CN2 may be disposed on the fifth insulating layer 50. A sixth insulating layer 60 may be disposed on the fifth insulating layer 50 to cover the second connection electrode CN2. At least one of the fifth insulating layer 50 and the sixth insulating layer 60 may include an organic layer, cover stepped portions of the components disposed below the fifth insulating layer 50 or the sixth insulating layer 60, and provide an approximately flat top surface.

The first connection electrode CN1 may be electrically connected to the semiconductor pattern SM through a contact hole passing through the second to fourth insulating layers 20 to 40. The second connection electrode CN2 may be electrically connected to the first connection electrode CN1 through a contact hole passing through the fifth insulating layer 50.

Each of the first connection electrode CN1 and the second connection electrode CN2 may include a conductive material. For example, each of the first connection electrode CN1 and the second connection electrode CN2 may include gold, silver, copper, aluminum, platinum, molybdenum, titanium, and alloys thereof. At least one of the first connection electrode CN1 or the second connection electrode CN2 may include conductive layers with a multilayer structure. For example, at least one of the first connection electrode CN1 or the second connection electrode CN2 may have a three-layer structure of titanium/aluminum/titanium. However, the embodiment may not be limited thereto.

Unlike this, at least one of the first connection electrode CN1 or the second connection electrode CN2 may be omitted. As another example, an additional connection electrode connecting the transistor TR and the light emitting element OL may be further disposed. The electrical connection method between the light emitting element OL and the transistor TR may be variously changed according to the number of insulating layers disposed between the light emitting element OL and the transistor TR, but may be limited to an embodiment.

The display element layer DP-OL may include a light emitting element OL and a pixel defining layer PDL. The light emitting element OL and the pixel defining layer PDL may be disposed on the sixth insulating layer 60. The light emitting element OL may include a first electrode AE, a second electrode CE disposed on the first electrode AE, and an emission layer EM disposed between the first electrode AE and the second electrode CE.

The pixel defining layer PDL may be transparent or may have the property of absorbing light. For example, the pixel defining layer PDL that absorbs light may include a black coloring agent. The black coloring agent may include a black dye or a black pigment. The black coloring agent may include carbon black, a metal such as chromium, or oxide thereof. The pixel defining layer PDL may correspond to a shield pattern having light blocking properties.

The pixel defining layer PDL may cover a portion of the first electrode AE. For example, a pixel opening PX-OP exposing a portion of the first electrode AE may be defined in the pixel defining layer PDL. The pixel defining layer PDL may increase in distance between an edge of the first electrode AE and the second electrode CE. Thus, the pixel defining layer PDL may serve to prevent arc or the like from occurring at the edge of the first electrode AE.

The first electrode AE may be electrically connected to the second connection electrode CN2 through a contact hole passing through the sixth insulating layer 60. The first electrode AE may be electrically connected to the transistor TR through the first and second connection electrodes CN1 and CN2.

The first electrode AE may be an anode or a cathode. The first electrode AE may be a transparent electrode, a translucent electrode, or a reflective electrode. The first electrode AE may include a reflective layer made of silver (Ag), magnesium (Mg), aluminum (Al), platinum (Pt), palladium (Pd), gold (Au), nickel (Ni), neodymium (Nd), iridium (Ir), chromium (Cr), a compound thereof, or a combination thereof, and may further include a transparent or translucent electrode layer disposed above the reflective layer. The transparent or translucent electrode layer may include at least one or more selected from a group consisting of indium tin oxide (ITO), indium zinc oxide (IZO), indium gallium zinc oxide (IGZO), zinc oxide ($ZnO_x$) or indium oxide ($In_2O_3$), and aluminum doped zinc oxide (AZO). For example, the first electrode AE may include a three-layered structure of ITO/Ag/ITO, but may not be limited thereto.

For example, the emission layer EM may include an organic light emitting material, an inorganic light emitting material, an organic-inorganic light emitting material, a quantum dot, a quantum rod, a micro LED, or a nano LED. For example, the emission layer EM may include a fluorescent material or a phosphorescent material. The emission layer EM may be disposed in the pixel opening PX-OP defined in the pixel defining layer PDL. As another example, the emission layer EM may be disposed as a common layer.

The second electrode CE may be a cathode or an anode, but this embodiment may not be limited thereto. For example, in case that the first electrode AE may be the anode, the second electrode CE may be the cathode, and in case that the first electrode AE may be the cathode, the second electrode CE may be the anode. The second electrode CE may be disposed as a common layer. The second electrode CE may be referred to as a common electrode. For example, the second electrode CE may include at least one selected from Ag, Mg, Cu, Al, Pt, Pd, Au, Ni, Nd, Ir, Cr, Li, Ca, LiF, Mo, Ti, W, In, Sn, and Zn, two or more kinds of compounds selected from the above-described materials, a mixture of two or more kinds of above-described materials, or oxides thereof.

Although not shown, at least one of a hole transport layer, a hole injection layer, or an electron blocking layer may be disposed between the first electrode AE and the emission layer EM. At least one of an electron transport layer, an electron injection layer, and a hole blocking layer may be disposed between the emission layer EM and the second electrode CE.

The encapsulation layer ECL may be disposed on the display element layer DP-OL. The encapsulation layer ECL may be disposed on the light emitting element OL and the pixel defining layer PDL to seal the light emitting element OL. The encapsulation layer ECL may include at least one of an inorganic layer or an organic layer. For example, the encapsulation layer ECL may include a first inorganic layer EN1, an organic layer EN2, and a second inorganic layer EN3, which may be sequentially laminated. However, the configuration of the encapsulation layer ECL may not be limited to this as long as the encapsulation layer ECL seals the light emitting element OL.

The first and second inorganic layers EN1 and EN3 may protect the light emitting element OL from the moisture or oxygen introduced from the outside. The organic layer EN2 may prevent the foreign material from being introduced into the light emitting element OL and cover the stepped portions of components disposed below the organic layer EN2. For example, each of the first and second inorganic layers EN1 and EN3 may include at least one of silicon nitride, silicon oxynitride, silicon oxide, titanium oxide, or aluminum oxide. The organic layer EN2 may include an acrylic-based organic material. However, this may be an example, and the materials included in the first and second inorganic layers EN1 and EN3 and the organic layer EN2 may not be limited thereto.

The input sensing layer ISP may be disposed on the display panel DP. The input sensing layer ISP may include a base insulating layer IL1, a first sensing insulating layer IL2, a second sensing insulating layer IL3, a first sensing conductive layer CL1, and a second sensing conductive layer CL2. The above description may be applied to each configuration of the input sensing layer ISP.

The base insulating layer IL1 may be in contact with the uppermost layer of the encapsulation layer ECL. For example, the base insulating layer IL1 may be in contact with the second inorganic layer EN3 of the encapsulation layer ECL. The base insulating layer IL1 of the input sensing layer ISP may be disposed (e.g., directly disposed) on the base surface provided by the encapsulation layer ECL. However, this may be an example, and this embodiment may not be limited thereto. For example, the base insulating layer IL1 may be omitted, and the first sensing conductive layer CL1 of the input sensing layer ISP may be in contact with the encapsulation layer ECL.

The first sensing conductive layer CL1 may be disposed on the base insulating layer IL1, and the second sensing conductive layer CL2 may be disposed on the first sensing insulating layer IL2. The first sensing conductive layer CL1 and the second sensing conductive layer CL2 may constitute the sensing electrode TE. The sensing electrode TE may correspond to any one of the above-described first and second sensing electrodes TEX and TEY (see FIG. 5). For example, the first sensing conductive layer CL1 may include a connection pattern BP of the sensing electrode TE, and the second sensing conductive layer CL2 may include a sensing pattern SP of the sensing electrode TE. As another example, the first sensing conductive layer CL1 may include the sensing pattern SP, and the second sensing conductive layer CL2 may include the connection pattern BP.

The connection pattern BP may correspond to the above-described first connection pattern BP1 (see FIG. 5) or the above-described second connection pattern BP2 (see FIG. 5), and the sensing pattern SP may correspond to the above-described first sensing pattern SP1 (see FIG. 5) or the above-described second sensing pattern SP2 (see FIG. 5). The connection pattern BP may be disposed on a different layer from the sensing pattern SP and may be electrically connected through a contact hole passing through the first sensing insulating layer IL2. However, the embodiment may not be limited to this, and the connection pattern BP and the sensing pattern SP may be disposed on a same layer and may be integral with each other.

The sensing electrode TE may be a mesh-shaped pattern and may be disposed to correspond to an area on which the pixel defining layer PDL may be disposed. However, the embodiment may not be limited to this, and the sensing electrode TE may be provided as a single-shaped pattern that overlaps the light emitting element OL. In this case, the sensing electrode TE may include a transparent conductive material.

An optical layer RCL may be disposed on the input sensing layer ISP. The optical layer RCL may include at least one of a pigment and a dye. The optical layer RCL may include an optical pattern part CPT, a filter part CF, and an overcoat layer OC.

The optical pattern part CPT may not overlap the emission layer EM and may have a defined pattern opening CP-OP. The material constituting the optical pattern part CPT may not be particularly limited as long as it may be a material that absorbs light. The optical pattern part CPT may have a black color, and the optical pattern part CPT may include a black coloring agent. A black component may include a black dye and a black pigment. The black coloring agent may include carbon black, a metal such as chromium, or oxide thereof.

The filter part CF may be filled into the pattern opening CP-OP. The filter part CF may overlap the emission layer EM. The filter part CF may contain the pigment or the dye. Multiple filter parts CF may be provided, and each of the filter parts CF may be a red, green, or blue filter. The red filter may transmit red light, the green filter may transmit green light, and the blue filter may transmit blue light. The dye and/or pigment included in the filter part CF may be a material that transmits only light in a specific wavelength region among the light emitted from the display element layer DP-OL. Thus, the filter part CF may improve display quality and light efficiency of the display device EA (see FIG. 2).

The overcoat layer OC may be disposed on the optical pattern part CPT and the filter part CF. The overcoat layer OC may be a planarization layer. The overcoat layer OC may cover stepped portions between the optical pattern part CPT and the filter part CF disposed below the overcoat layer OC and provide an approximately flat surface. A top surface of the overcoat layer OC may be approximately flat. The overcoat layer OC may include an organic material.

The first insulating layer 10 and the second insulating layer 20 may extend from the first base area AA1 on the base layer BS and may be disposed on the second base area AA2. The first signal pad PD1 and the second signal pad PD2 may be disposed on the second insulating layer 20. The first signal pad PD1 may be disposed on a first sub pad area PA1-1, and the second signal pad PD2 may be disposed on a second sub pad area PA1-2. The first signal pad PD1 may be disposed closer to the display area DA on the first base area AA1 than the second signal pad PD2. The second signal pad PD2 may be spaced apart from the first base area AA1 with the first signal pad PD1 disposed therebetween.

Each of the first and second signal pads PD1 and PD2 may include multiple conductive patterns CP1, CP2, CP3, and CP4 arranged along the thickness direction D3. The first conductive pattern CP1 of each of the first signal pad PD1 and the second signal pad PD2 may be disposed on the second insulating layer 20.

The first conductive patterns CP1 of the first signal pad PD1 and the second signal pad PD2 and the gate GE of the transistor TR may be formed through a same process. For example, after forming a conductive layer on the second insulating layer 20 through a deposition process such as sputtering or chemical vapor deposition, the conductive layer may be patterned to form the first conductive patterns CP1 of the first and second signal pads PD1 and PD2 and the gate GE. The first conductive patterns CP1 of the first and second signal pads PD1 and PD2 and the gate GE of the transistor TR may be disposed on a same layer and may include a same material.

The third insulating layer 30 and the fourth insulating layer 40 may extend from the first base area AA1 and be disposed on the second base area AA2. A through-hole exposing the top surfaces of the first conductive patterns CP1 of the first signal pad PD1 and the second signal pad PD2 may be defined in the third insulating layer 30 and the fourth insulating layer 40. The third insulating layer 30 and the fourth insulating layer 40 may be formed by sequentially depositing the insulating layers on the first base area AA1 and the second base area AA2 and etching the insulating layers on the first base area AA1 and the second base area AA2 so that a portion of the top surface of each of the first conductive patterns CP1 of the first and second signal pads PD1 and PD2 may be exposed.

As illustrated in FIG. 7A, at least a portion of the insulating layers disposed on the first base area AA1 may be disposed on the second base area AA2, and the laminated structure of the insulating layers disposed on the second base area AA2 may not be particularly limited to the drawings.

The second conductive patterns CP2 of the first signal pad PD1 and the second signal pad PD2 may be disposed on the exposed top surfaces of the first conductive patterns CP1, respectively. The second conductive patterns CP2 may be in contact with the first conductive patterns CP1, respectively. A portion of the second conductive patterns CP2 may be disposed on the fourth insulating layer 40. For example, a portion of the second conductive patterns CP2 may cover inner surfaces of the third and fourth insulating layers 30 and 40 exposed by the through-hole and be disposed on the fourth insulating layer 40.

The second conductive patterns CP2 of the first and second signal pads PD1 and PD2 and one of the conductive electrodes of the circuit layer DP-CL may be formed through a same process. For example, the second conductive patterns CP2 of the first signal pad PD1 and the second signal pad PD2 may be formed through a same process as the first connection electrode CN1. After forming a conductive layer on the fourth insulating layer 40 through a deposition process such as sputtering or chemical vapor deposition, the conductive layer may be patterned to form the first connection electrode CN1 and the second conductive patterns CP2 of the first and second signal pads PD1 and PD2. The second conductive patterns CP2 of the first and second signal pads PD1 and PD2 and the first connection electrode CN1 may be disposed on a same layer and may include a same material.

The third conductive patterns CP3 of the first signal pad PD1 and the second signal pad PD2 may be disposed on the second conductive patterns CP2, respectively. The third conductive patterns CP3 may be in contact with the second conductive patterns CP2, respectively. The third conductive patterns CP3 of the first and second signal pads PD1 and PD2 and one of the conductive electrodes of the circuit layer DP-CL may be formed through a same process. For example, the third conductive patterns CP3 of the first signal pad PD1 and the second signal pad PD2 and the second connection electrode CN2 may be formed through a same process. The fifth insulating layer 50 disposed below the second connection electrode CN2 may be opened corresponding to an area on which the first and second signal pads PD1 and PD2 may be disposed. The fifth insulating layer 50 may not be disposed on the second conductive patterns CP2 of the first and second signal pads PD1 and PD2, but a portion of the conductive layer deposited on the fifth insulating layer 50 may be in contact with the second conductive patterns CP2. After forming a conductive layer on the fifth insulating layer 50 through a deposition process such as sputtering or chemical vapor deposition, the conductive layer may be patterned to form the second connection electrode CN2 and the third conductive patterns CP3 of the first and second signal pads PD1 and PD2. The third conductive patterns CP3 and the second connection electrode CN2 and may be formed through a same process and include a same material.

First and second insulating patterns IP1 and IP2 may be disposed on the second base area AA2. The first insulating pattern IP1 may be disposed to correspond to the first signal pad PD1 and may cover an edge of the first signal pad PD1. Specifically, the first insulating pattern IP1 may cover the edge of the third conductive pattern CP3 of the first signal pad PD1. The second insulating pattern IP2 may be disposed to correspond to the second signal pad PD2 and may cover an edge of the second signal pad PD2. Specifically, the second insulating pattern IP2 may cover the edge of the third conductive pattern CP3 of the second signal pad PD2. For example, the edges of the third conductive patterns CP3 of the first and second signal pads PD1 and PD2 may be disposed on the fourth insulating layer 40, and the first and second insulating patterns IP1 and IP2 may be respectively disposed on the fourth insulating layer 40 to cover the edges of the third conductive patterns CP3.

The first and second insulating patterns IP1 and IP2 may be formed at a same time through a same process as at least one of the insulating layers included in the circuit layer DP-CL. For example, the formation of first and second insulating patterns IP1 and IP2 and the formation of the sixth insulating layer 60 may occur at a same time. After forming an insulating layer on the fifth insulating layer 50 and the third conductive patterns CP3 of the first and second signal pads PD1 and PD2 through a process such as deposition, coating, or printing, the insulating layer may be patterned to form the sixth insulating layer 60 and the first and second insulating patterns IP1 and IP2. The first and second insulating patterns IP1 and IP2 and the sixth insulating layer 60 may include a same material. The first and second insulating patterns IP1 and IP2 may be formed by etching or patterning the insulating layer to cover the edges of the third conductive patterns CP3 of the first and second signal pads PD1 and PD2, respectively.

The first and second insulating patterns IP1 and IP2 may include organic materials. For example, each of the first and second insulating patterns IP1 and IP2 may include at least one of an acrylic resin, a methacrylic resin, polyisoprene, a vinyl resin, an epoxy resin, a urethane resin, a cellulose resin, a siloxane resin, and a polyamide resin, or a perylene-based resin. However, this may be an example, and the materials included in the first and second insulating patterns IP1 and IP2 may not be limited thereto.

The base insulating layer IL1 of the input sensing layer ISP may extend from the first base area AA1 and be disposed on the second base area AA2. The base insulating layer IL1 disposed on the second base area AA2 may be defined as an insulating layer IF. The base insulating layer IL1 disposed on the first base area AA1 and the insulating layer IF disposed on the second base area AA2 may be integral with each other.

However, the embodiment may not be limited to this, and both the base insulating layer IL1 and the first sensing insulating layer IL2 of the input sensing layer ISP may extend from the first base area AA1 and be disposed on the second base area AA2. In this case, the base insulating layer IL1 and the first sensing insulating layer IL2 laminated on the second base area AA2 may correspond to the insulating layer IF.

The forming of the insulating layer IF and the forming process of the insulating layer (e.g., the base insulating layer IL1 or the first sensing insulating layer IL2) included in the input sensing layer ISP may occur at a same time. For example, after depositing an insulating layer on the first and second base areas AA1 and AA2 through a deposition process such as chemical vapor deposition, the insulating layer may be etched or patterned to form the base insulating layer IL1 (or first sensing insulating layer IL2) and the insulating layer IF.

The insulating layer IF may include an inorganic material and prevent moisture or oxygen from being introduced. For example, the insulating layer IF may include at least one of aluminum oxide, titanium oxide, silicon oxide, silicon oxide nitride, zirconium oxide, or hafnium oxide. However, the material included in the insulating layer IF may not be limited thereto.

The insulating layer IF may be disposed on the first and second insulating patterns IP1 and IP2. The insulating layer IF may be disposed to cover the first and second insulating patterns IP1 and IP2. The insulating layer IF may overlap the edge of the third conductive pattern CP3 of the first and second signal pads PD1 and PD2.

Multiple openings OP1 and OP2 may be defined in the insulating layer IF. The first opening OP1 of the insulating layer IF may be defined to correspond to the first sub pad area PA1-1, and the second opening OP2 of the insulating layer IF may be defined to correspond to the second sub pad area PA1-2. The first opening OP1 may expose the first signal pad PD1, and the second opening OP2 may expose the second signal pad PD2.

The fourth conductive patterns CP4 of the first signal pad PD1 and the second signal pad PD2 may be disposed on the top surfaces of the third conductive patterns CP3 exposed from the insulating layer IF, respectively. The fourth conductive patterns CP4 may be in contact with the third conductive patterns CP3. The fourth conductive pattern CP4 of the first signal pad PD1 may be exposed through the first opening OP1, and the fourth conductive pattern CP4 of the second signal pad PD2 may be exposed through the second opening OP2. A portion of the fourth conductive patterns CP4 of the first and second signal pads PD1 and PD2 may be disposed on the insulating layer IF. For example, the fourth conductive pattern CP4 of the first signal pad PD1 may be disposed on the insulating layer IF overlapping the third conductive pattern CP3 of the first signal pad PD1. The fourth conductive pattern CP4 of the second signal pad PD2 may be disposed on the insulating layer IF overlapping the third conductive pattern CP3 of the second signal pad PD2. However, this may be an example, and this embodiment may not be limited thereto.

The fourth conductive patterns CP4 of the first signal pad PD1 and the second signal pad PD2 and any one of the conductive layers of the input sensing layer ISP may be formed through a same process. For example, the fourth conductive patterns CP4 of the first and second signal pads PD1 and PD2 and the first sensing conductive layer CL1 or the second sensing conductive layer CL2 may be formed through a same process. The fourth conductive patterns CP4 and the first sensing conductive layer CL1 or the second sensing conductive layer CL2 may include a same material. For example, after the base insulating layer IL1 and the insulating layer IF are formed, the conductive layer may be formed thereon through the deposition process such as sputtering or chemical vapor deposition, and the conductive layer may be patterned to form a first sensing conductive layer CL1 and fourth conductive patterns CP4 of the first and second signal pads PD1 and PD2.

A lighting circuit part TLP may be disposed on the second base area AA2. The lighting circuit part TLP may be disposed between the first signal pad PD1 and the second signal pad PD2. The lighting circuit part TLP may be disposed on the second base area AA2 of the non-display area NDA. The lighting circuit part TLP may be configured to check whether the pixel PX (see FIG. 4) may be operating normally before attaching the flexible circuit board FCB during the manufacturing process of the display device EA (see FIG. 2). After completion of the manufacturing process, the lighting circuit TLP may remain in the display device EA (FIG. 2). The lighting circuit part TLP may include first and second inspection lines TL1 and TL2 for inspecting the lighting of the pixel PX (see FIG. 4). However, the embodiment may not be limited to this, and the lighting circuit part TLP may include three or more inspection lines arranged on different layers. During the manufacturing process of the display device EA (see FIG. 2), each of the first and second inspection lines TL1 and TL2 may be electrically connected to at least one signal line SL1 to SLm, DL1 to DLn, EL1 to ELm, CSL1, CSL2, or PL (see FIG. 4) to inspect whether the pixel PX (see FIG. 4) may be operating normally.

For example, the first and second inspection lines TL1 and TL2 may be formed in the process of forming the transistor TR in the circuit layer DP-CL. The first inspection line TL1 may be formed during the process of forming the semiconductor pattern SM. In the process of forming the semiconductor pattern SM on the first insulating layer 10, the first inspection line TL1 may be formed. The second inspection line TL2 may be formed in the process of forming the gate GE. In the process of forming the gate GE on the second insulating layer 20, the second inspection line TL2 may be formed. However, the process of forming the first and second inspection lines TL1 and TL2 may not be limited to this, and each of the first and second inspection lines TL1 and TL2 and one of the above-described signal lines SL1 to SLm, DL1 to DLn, EL1 to ELm, CSL1, CSL2, and PL (see FIG. 4) may be formed at a same time.

At least one of the first and second inspection lines TL1 and TL2 and at least one of the first and second signal pads PD1 and PD2 may be disposed on a same layer. For example, the second inspection line TL2 and the first conductive patterns CP1 of the first and second signal pads PD1 and PD2 may be disposed on a same layer. However, the arrangement position of the lighting circuit part TLP may not be limited to one embodiment as long as it may be disposed on any one of the inorganic insulating layers of the circuit layer DP-CL. For example, the inorganic insulating layers may be the first to fourth insulating layers 10 to 40.

An organic protection layer OF may be disposed on the lighting circuit part TLP. The organic protection layer OF may not overlap the first and second signal pads PD1 and PD2. The organic protection layer OF may overlap the lighting circuit part TLP. The organic protection layer OF may be disposed on an area overlapping the lighting circuit part TLP. The organic protection layer OF may protect the lighting circuit part TLP. The insulating layer IF may be disposed between the lighting circuit part TLP and the organic protection layer OF. The organic protection layer OF may be disposed on the insulating layer IF. The lighting circuit TLP may be disposed below the insulating layer IF. For example, the organic protection layer OF may be disposed on an area of the insulating layer IF that overlaps the lighting circuit TLP. The organic protection layer OF may include an organic material and may be a layer that protects a component disposed below the organic protection layer OF.

In the display device according to the related art, the insulating layer containing the inorganic material may be disposed on the organic protection layer. The organic protection layer containing the organic material may be vulnerable to high temperature/high humidity conditions, and in case that the organic protection layer is expanded under the high temperature/high humidity conditions, the insulating layer disposed on the organic protection layer may be also lifted. The moisture and/or oxygen may be introduced into a gap generated in case that the insulating layer is lifted to cause corrosion of the first and second signal pads adjacent to the insulating layer.

To prevent the moisture and/or oxygen from being introduced into the gap caused by the insulating layer being lifted, an opening may be defined in a portion of the insulating layer adjacent to the first and second signal pads. The opening may be spaced apart from the first and second signal pads and be provided in a rectangular shape extending in a direction in a plan view. The square-shaped opening extending in a direction may generate the most stress in case of bending the bending area of the display panel and thus be vulnerable to cracks.

Unlike this, in the display device EA (see FIG. 2) according to an embodiment, the organic protection layer OF that protects the lighting circuit part TLP may be disposed on the insulating layer IF containing the inorganic material, and thus, even if the organic protection layer OF is expanded, it may not affect the insulating layer IF. Since the square-shaped opening extending in a direction may not be defined in the insulating layer IF, the occurrence of the cracks due to the bending of the bending area BA (see FIG. 4) may be prevented. Thus, the display device EA (see FIG. 2) according to an embodiment may exhibit excellent reliability.

The organic protection layer OF and the sensing insulating layers IL2 and IL3 or the optical layer RCL of the input sensing layer ISP may include a same organic material. For example, the first sensing insulating layer IL2 disposed on the first base area AA1 or the organic protection layer OF disposed on the second sensing insulating layer IL3 and the second base area AA2 may be integral with each other.

The organic protection layer OF and the first sensing insulating layer IL2 or the second sensing insulating layer IL3 may be formed at a same time. The organic protection layer OF and the first sensing insulating layer IL2 or the second sensing insulating layer IL3 may be formed at a same time and may include a same organic material. For example, after depositing the insulating layer on the first and second base areas AA1 and AA2 through the deposition process such as chemical vapor deposition, the insulating layer may be etched or patterned to form the first sensing insulating layer IL2 (or second sensing insulating layer IL3) and the organic protection layer OF.

Unlike this, the organic protection layer OF and the optical layer RCL may include a same organic material. The organic protection layer OF and the overcoat layer OC of the optical layer RCL may include a same organic material. For example, the overcoat layer OC disposed on the first base area AA1 and the organic protection layer OF disposed on the second base area AA2 may be integral with each other. The organic protection layer OF and the overcoat layer OC may be formed at a same time. The organic protection layer OF and the overcoat layer OC may be formed at a same time and may include a same organic material. For example, after depositing the organic layer on the first and second base areas AA1 and AA2 through the deposition process such as chemical vapor deposition, the organic layer may be etched or patterned to form the overcoat layer OC and the organic protection layer OF.

Figure 7B:
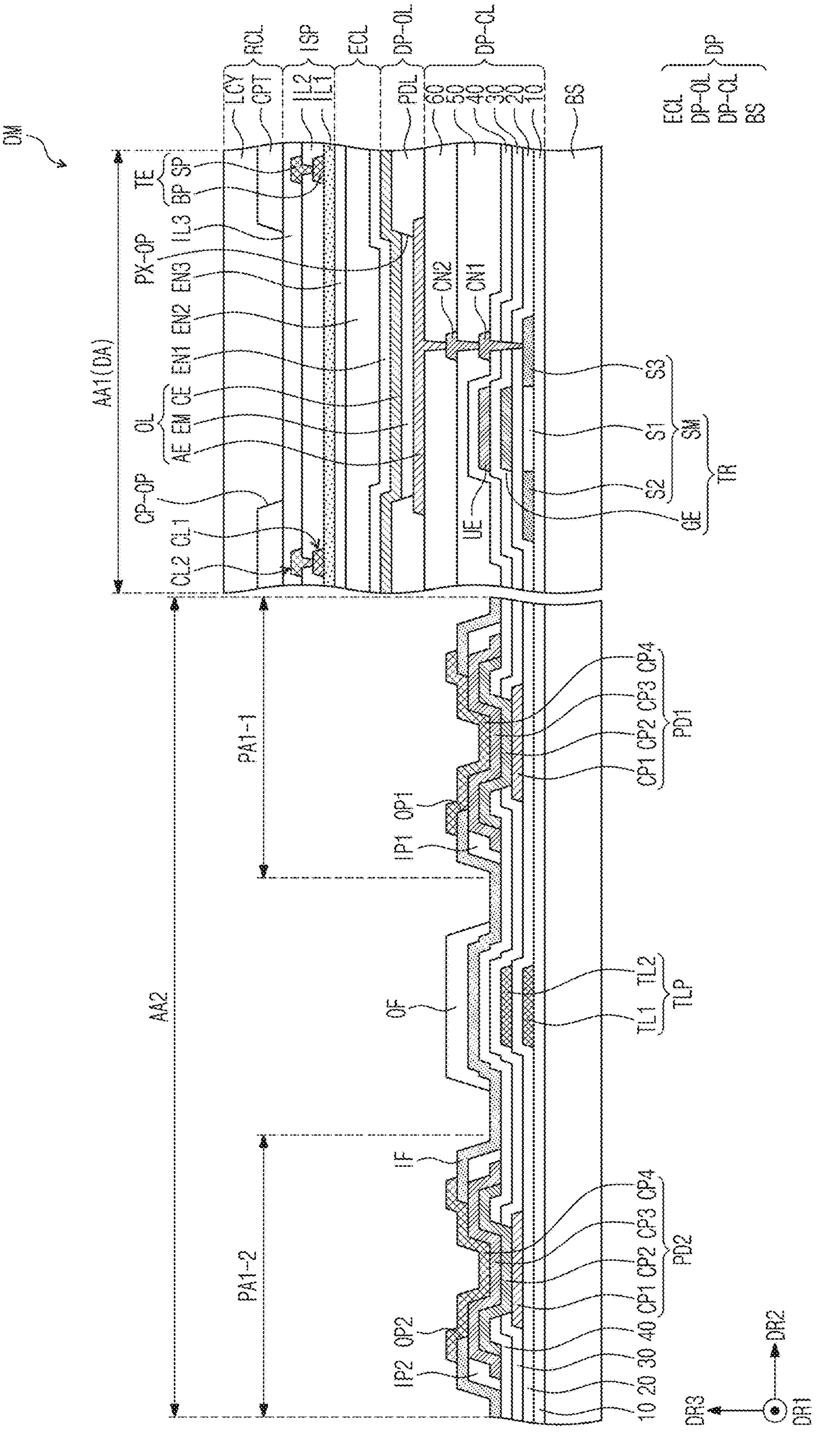
FIG. 7B is a schematic cross-sectional view illustrating a portion of the display device according to an embodiment.

FIG. 7B is a schematic cross-sectional view illustrating a display module DM according to an embodiment of the inventive concept. Hereinafter, in describing of FIG. 7B, contents duplicated with the contents described with reference to FIGS. 1 to 7A will not be described again, and differences will be explained.

In comparison to FIG. 7A, the difference in FIG. 7B is that an optical layer RCL includes an optical pattern part CPT and a light control layer LCY. The light control layer LCY may be filled into the pattern opening CP-OP of the optical pattern part CPT and may be disposed on the optical pattern part CPT. The light control layer LCY may cover the optical pattern part CPT. The light control layer LCY may be a layer that selectively transmits light emitted from a display panel DP. A dye and pigment included in the light control layer LCY may be materials that transmit only light having a specific wavelength range among the light emitted from a display element layer DP-OL. Thus, the light control layer LCY may improve display quality and light efficiency of the display device EA (see FIG. 2).

The light control layer LCY may be a planarization layer. The light control layer LCY may include the pigment and/or dye. The dye and/or pigment included in the light control layer LCY may be a material that transmits only light having a specific wavelength range among the light emitted from the display element layer DP-OL. Thus, the light control layer LCY may improve display quality and light efficiency of the display device EA (see FIG. 2).

An organic protection layer OF and the light control layer LCY may include a same organic material. For example, the light control layer LCY disposed on a first base area AA1 and the organic protection layer OF disposed on a second base area AA2 may be integral with each other. The organic protection layer OF and the light control layer LCY may be formed at a same time and in a same process. The organic protection layer OF and the light control layer LCY may be formed at a same time and may include a same organic material. For example, after depositing an organic layer on the first and second base areas AA1 and AA2 through a deposition process such as chemical vapor deposition, the organic layer may be etched or patterned to form the light control layer LCY and the organic protection layer OF.

The display device EA (see FIG. 2) according to an embodiment may include an insulating layer IF containing an inorganic material and an organic protection layer OF that protects the lighting circuit part TLP on the lighting circuit part TLP. The organic protection layer OF and an input sensing layer ISP or an optical layer RCL may include a same organic material. In addition to the input sensing layer ISP and the optical layer RCL, the organic protection layer OF and the member made of an organic material may include a same organic material, and the organic protection layer OF may be disposed on the light emitting element OL. In an embodiment, the organic protection layer OF may be disposed on the insulating layer IF containing the inorganic material, and thus, even in case that the organic protection layer OF containing the organic material is deformed, the insulating layer IF may not be affected. Thus, the display device EA (see FIG. 2) according to an embodiment may exhibit excellent reliability.

Figure 8A:
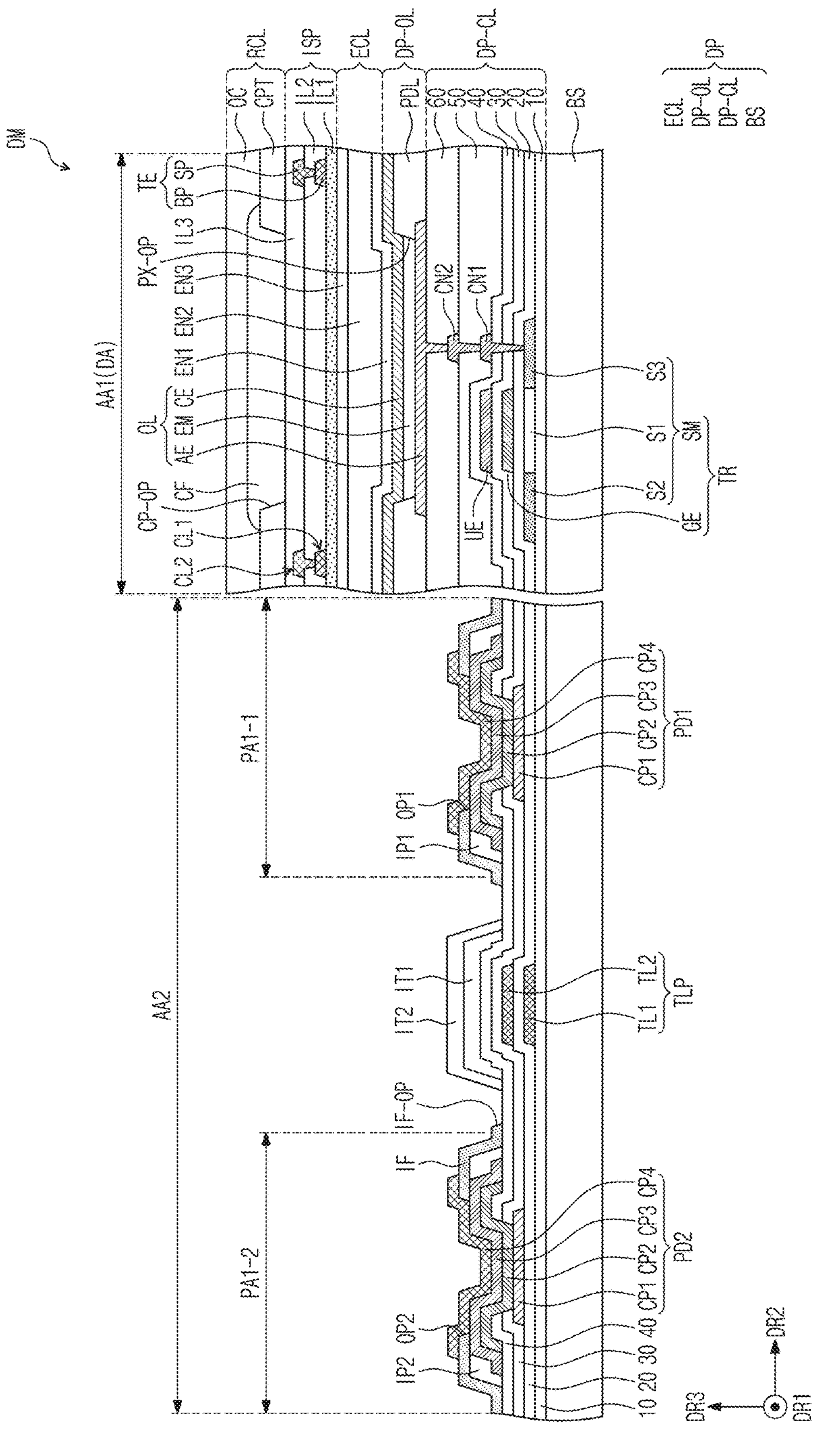
FIG. 8A is a schematic cross-sectional view illustrating a portion of the display device according to an embodiment.

FIG. 8A is a perspective view illustrating a display module DM according to an embodiment of the inventive concept. Hereinafter, in describing FIG. 8A, contents duplicated with those described with reference to FIGS. 1 to 7A will not be described again, and differences will be described.

In comparison with FIG. 7A, in FIG. 8A, there may be a difference in that a third opening IF-OP may be defined in an insulating layer IF, and organic protection layers IT1 and IT2 (hereinafter, referred to as first and second organic patterns) may be disposed. Referring to FIG. 8A, first to third openings OP1, OP2, and IF-OP may be defined in an insulating layer IF. First and second organic patterns IT1 and IT2 may be disposed on a lighting circuit TLP. The first and second organic patterns IT1 and IT2 may protect the lighting circuit part TLP. Each of the first and second organic patterns IT1 and IT2 may include an organic material. The first organic pattern IT1 may be disposed on the lighting circuit part TLP, and the second organic pattern IT2 may be disposed on the first organic pattern IT1. The first and second organic patterns IT1 and IT2 may be disposed on an area that overlaps the lighting circuit part TLP. The first and second organic patterns IT1 and IT2 may not overlap first and second signal pads PD1 and PD2. For example, the first and second organic patterns IT1 and IT2 may be disposed on an area of a fourth insulating layer 40 that overlaps the lighting circuit part TLP. The first and second organic patterns IT1 and IT2 may include an organic material and may be a layer that protects a component disposed below the first and second organic patterns IT1 and IT2.

For example, the first organic pattern IT1 and the fifth insulating layer 50 may be formed at a same time and in a same process. After forming an insulating layer on the fourth insulating layer 40 through a process such as deposition, coating, or printing, the insulating layer may be patterned to form the fifth insulating layer 50 and the first organic pattern IT1. Thereafter, the second organic pattern IT2 may be formed on the first organic pattern IT1.

For example, the second organic pattern IT2 and the sixth insulating layer 60 may be formed at a same time and in a same process. After forming an insulating layer on the fifth insulating layer 50 and the third conductive patterns CP3 of the first and second signal pads PD1 and PD2 through a process such as deposition, coating, or printing, the insulating layer may be patterned to form the sixth insulating layer 60, the first and second insulating patterns IP1 and IP2, and the second organic pattern IT2. The second organic pattern IT2 and the sixth insulating layer 60 may include a same material.

After forming the first and second organic patterns IT1 and IT2, the insulating layer IF may be formed. After forming the insulating layer on the fourth insulating layer 40 and the organic patterns IT1 and IT2, the insulating layer may be patterned to form the insulating layer IF with a third opening IF-OP defined therein. The third opening IF-OP may overlap the lighting circuit part TLP.

The insulating layer IF with the third opening IF-OP defined therein may not overlap the organic patterns IT1 and IT2. The organic patterns IT1 and IT2 may be exposed through the third opening IF-OP. In a direction perpendicular to the thickness direction DR3, the insulating layer IF may be spaced apart from the organic patterns IT1 and IT2. In case that the organic patterns are in contact with an inner surface of the insulating layer defining the third opening, the inner surface of the insulating layer may be affected in case that the organic patterns containing the organic material expand, and thus, first and second signal pads may be damaged. Unlike this, in an embodiment, the third opening IF-OP exposing the organic patterns IT1 and IT2 may be defined, and the display device EA (see FIG. 2) including the insulating layer IF spaced apart from the organic patterns IT1 and IT2 may exhibit excellent reliability.

The third opening IF-OP may be defined in an area between a first sub pad area PA1-1 and a second sub pad area PA1-2. The third opening IF-OP may not overlap the first and second signal pads PD1 and PD2. In a direction perpendicular to the thickness direction DR3, the third opening IF-OP may be defined between the first and second openings OP1 and OP2.

Figure 8B:
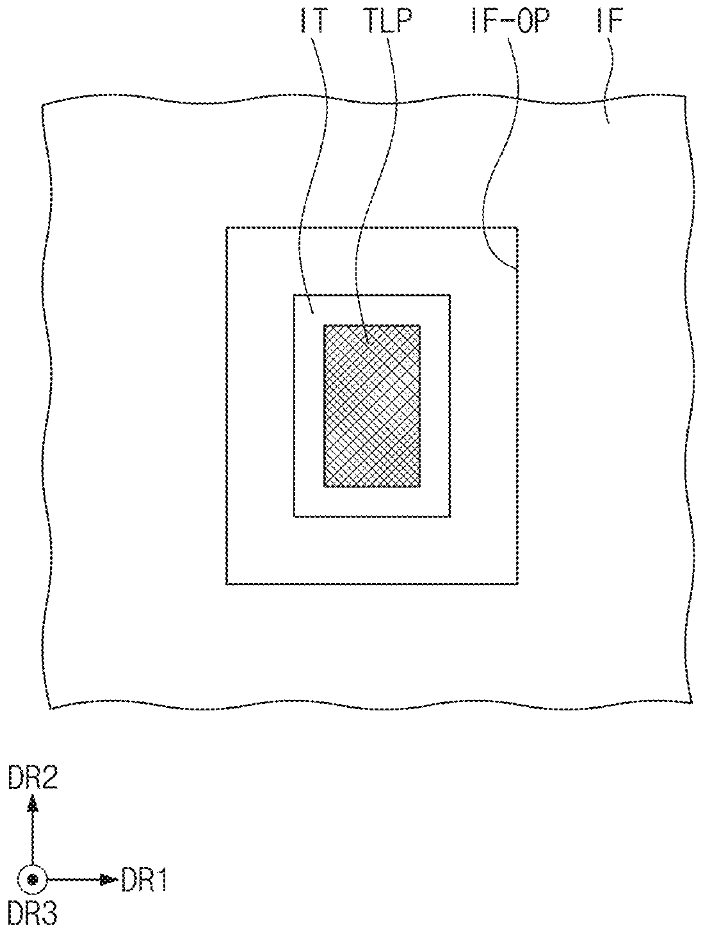
FIG. 8B is a plan view illustrating a portion of the display device according to an embodiment.

FIG. 8B is a plan view illustrating the insulating layer IF, the first and second organic patterns IT1 and IT2, and the lighting circuit part TLP of FIG. 8A. FIG. 8B is briefly illustrated for convenience of explanation, and the organic pattern IT of FIG. 8B may correspond to the first and second organic patterns IT1 and IT2 of FIG. 8A. Referring to FIG. 8B, the organic pattern IT may be exposed through the third opening IF-OP. The insulating layer IF in which the third opening IF-OP may be defined may be spaced apart from the organic pattern IT.

Figure 9:
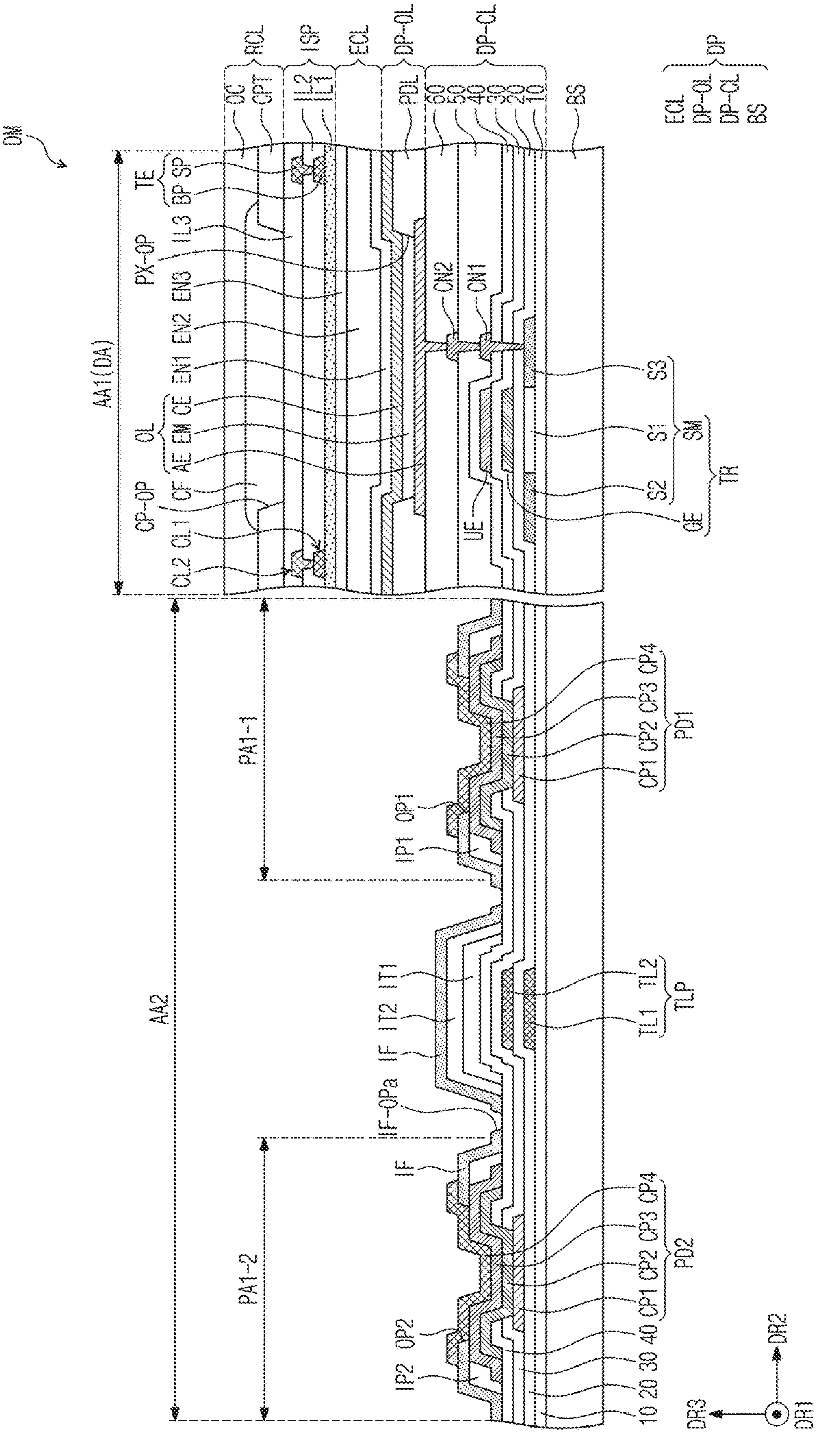
FIG. 9 is a schematic cross-sectional view illustrating a portion of the display device according to an embodiment.

FIG. 9 is a schematic cross-sectional view of the display module DM according to an embodiment of the inventive concept. Hereinafter, in describing FIG. 9, contents duplicated with those described with reference to FIGS. 1 to 8A will not be described again, and differences will be described.

In comparison to FIG. 8A, in FIG. 9, there may be a difference in that an insulating layer IF covers first and second organic patterns IT1 and IT2, and a third opening IF-OPa may be defined. The third opening IF-OPa may be defined between a first signal pad PD1 and a lighting circuit part TLP and between the lighting circuit part TLP and a second signal pad PD2.

An insulating layer IF may be disposed to cover the first and second organic patterns IT1 and IT2, and thus, in case that the first and second organic patterns IT1 and IT2expand, the insulating layer IF may be lifted to generate a gap, and the gap may also serve an inflow path of moisture and/or oxygen. However, as the third opening IF-OPa may be defined in the insulating layer IF, the moisture and oxygen may not be introduced into the first and second signal pads PD1 and PD2. In the insulating layer IF, a portion overlapping (or in a vicinity of) the first and second signal pads PD1 and PD2 and another portion covering the first and second organic patterns IT1 and IT2 may be disconnected (or spaced apart) from each other due to the third opening IF-OPa, and thus, even if the gap occurs, the moisture and oxygen may not be introduced into the first and second signal pads PD1 and PD2. Thus, the display device EA (see FIG. 2) according to an embodiment including the insulating layer IF with the third opening IF-OPa defined therein may exhibit excellent reliability.

FIGS. 10A to 10F are plan views illustrating constituents illustrated in FIG. 9, and only some of the constituents may be illustrated for convenience of explanation. The third opening IF-OPa illustrated in FIG. 9 and one of third openings IF-OPa1, IF-OPa2, IF-OPa3, IF-OPa4, IF-OPa5, and IF-OPa6 illustrated in FIGS. 10A to 10F respectively may have a same shape. Hereinafter, in describing FIGS. 10A to 10F, contents duplicated with the contents described with reference to FIGS. 1 to 9 will not be described again, and the differences will be explained.

Referring to FIGS. 10A to 10F, the third openings IF-OPa1, IF-OPa2, IF-OPa3, IF-OPa4, IF-OPa5, and IF-OPa6 respectively may be defined between the first signal pad PD1 and the lighting circuit part TLP and between the lighting circuit part TLP and the second signal pad PD2. The shapes of the third openings IF-OPa1, IF-OPa2, IF-OPa3, IF-OPa4, IF-OPa5, and IF-OPa6 defined between the first signal pad PD1 and the lighting circuit part TLP and the shapes of the third openings IF-OPa1, IF-OPa2, IF-OPa3, IF-OPa4, IF-OPa5, and IF-OPa6 defined between the lighting circuit part TLP and the second signal pad PD2 may be the same. Hereinafter, the description will focus on the third openings IF-OPa1, IF-OPa2, IF-OPa3, IF-OPa4, IF-OPa5, and IF-OPa6 defined between the first signal pad PD1 and the lighting circuit part TLP. The above description may be equally provided to the third openings IF-OPa1, IF-OPa2, IF-OPa3, IF-OPa4, IF-OPa5, and IF-OPa6 defined between the lighting circuit part TLP and the second signal pad PD2.

Figure 10A:
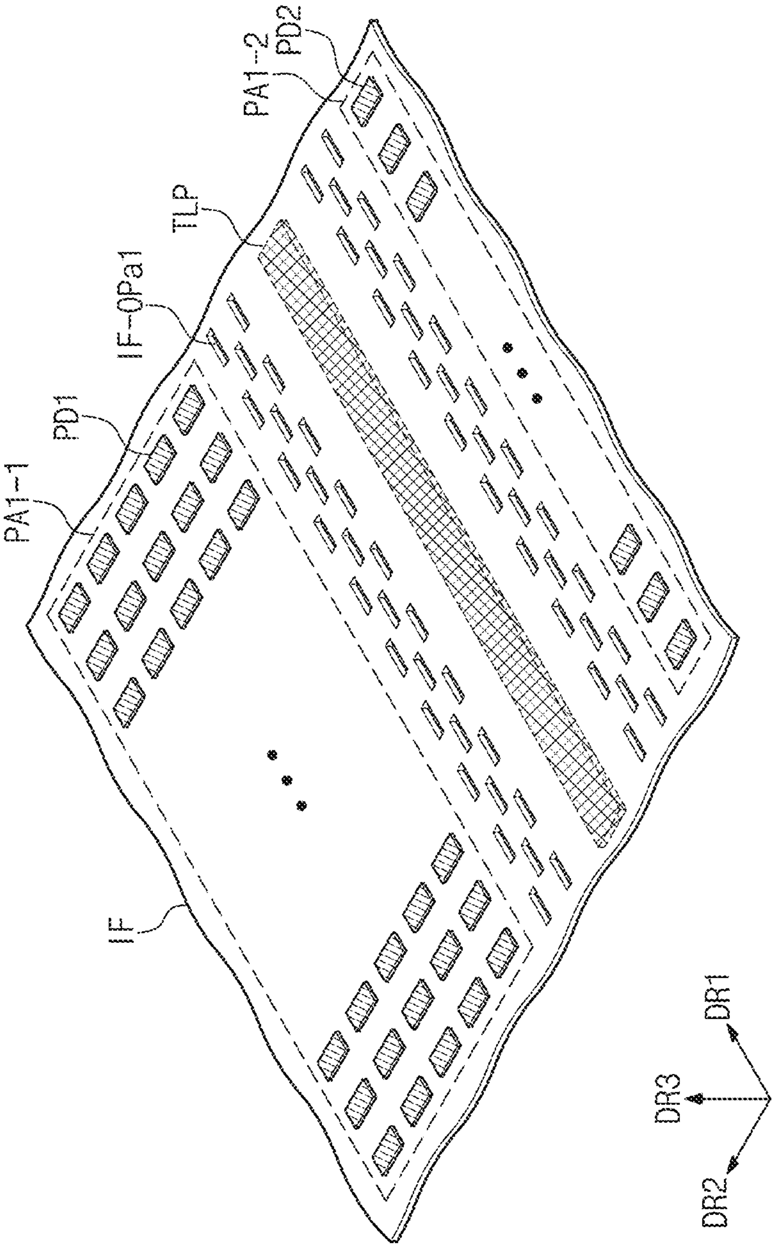
FIG. 10A is a perspective view illustrating a portion of the display device according to an embodiment.

Referring to FIG. 10A, multiple third openings IF-OPa1 may be provided. Each of the third openings IF-OPa1 may have a rectangular shape, and the rectangles may be arranged in a dotted line.

In the second direction DR2, the third openings IF-OPa1 may be arranged in three rows. In each of the three rows, the third openings IF-OPa1 may be spaced apart from each other in the first direction DR1. The third openings IF-OPa1 in the second row may be defined not to be in parallel to the third openings IF-OPa1 in the first and third rows. That is, an inner surface defining the third opening IF-OPa1 in the second row may not be parallel to (i.e., may be staggered with respect to) an inner surface defining the third opening IF-OPa1 in the first and third rows. Thus, in case of bending the bending area BA (see FIG. 4), stress occurring in the third opening IF-OPa1 may be minimized or prevented. In the related art, the third opening was defined in a single square shape, and in case of bending the bending area, a lot of stress was generated in the opening to cause cracks. Unlike this, in an embodiment, the third opening IF-OPa1 defined in the dotted line shape may minimize or prevent the stress generation in case of bending the bending area BA (see FIG. 4).

Figure 10B:
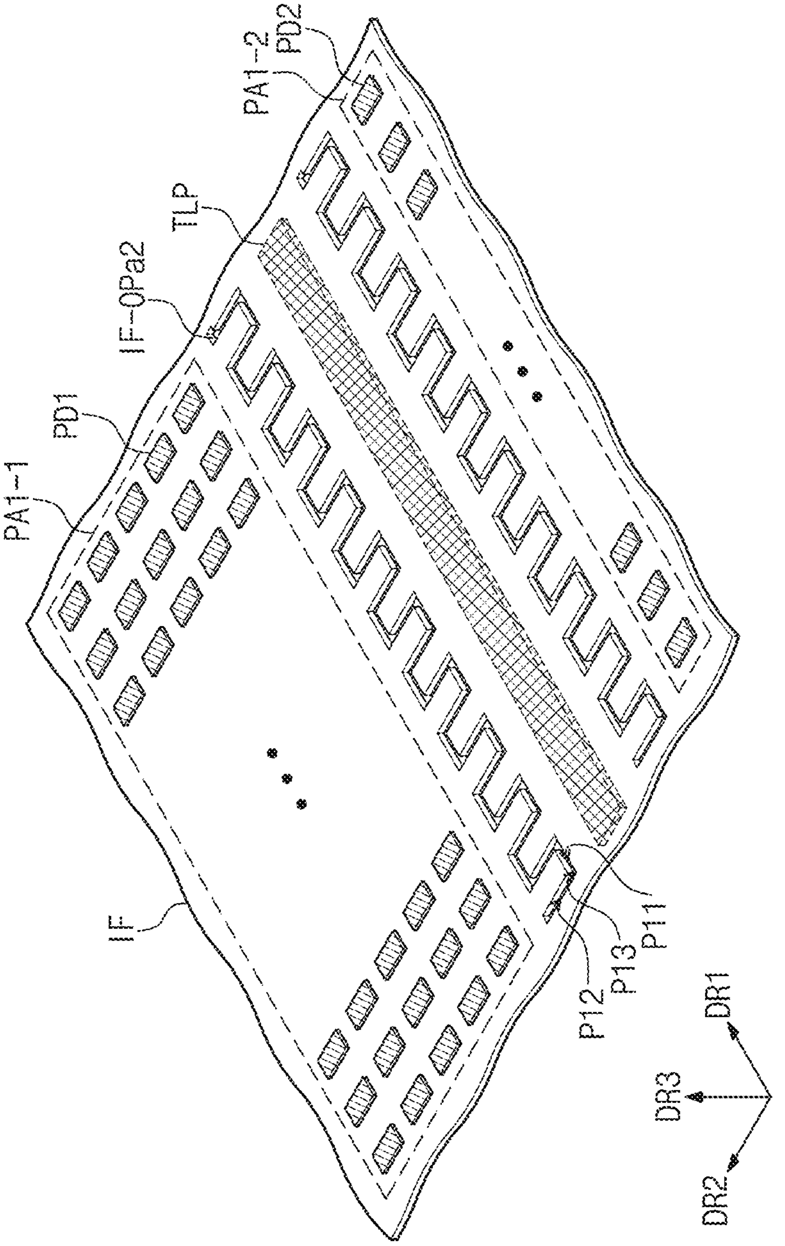
FIG. 10B is a perspective view illustrating a portion of the display device according to an embodiment.

Referring to FIG. 10B, the third opening IF-OPa2 may include a first portion P11, a second portion P12, and an intersection P13. The first portion P11 may extend in the first direction DR1, the second portion P12 may extend in the second direction DR2, and the intersection P13 may be a portion disposed between the first portion P11 and the second portion P12. The first portion P11, the second portion P12, and the intersection P13 may have an integrated shape. The first portion P11, the intersection P13, and the second portion P12 may be alternately and repeatedly disposed. The first portion P11, the intersection P13, and the second portion P12 may have a shape of the letter U (or an upside down U shape in a plan view). The third opening IF-OPa2 illustrated in FIG. 10B may have a shape in which the letter U and the upside-down letter U may be repeatedly arranged. Thus, in case of bending the bending area BA (see FIG. 4), stress occurring in the third opening IF-OPa2 may be minimized or prevented. In an embodiment, the third opening IF-OPa2, which may not be a single square shape, may minimize the stress generation in case of bending the bending area BA (see FIG. 4).

Figure 10C:
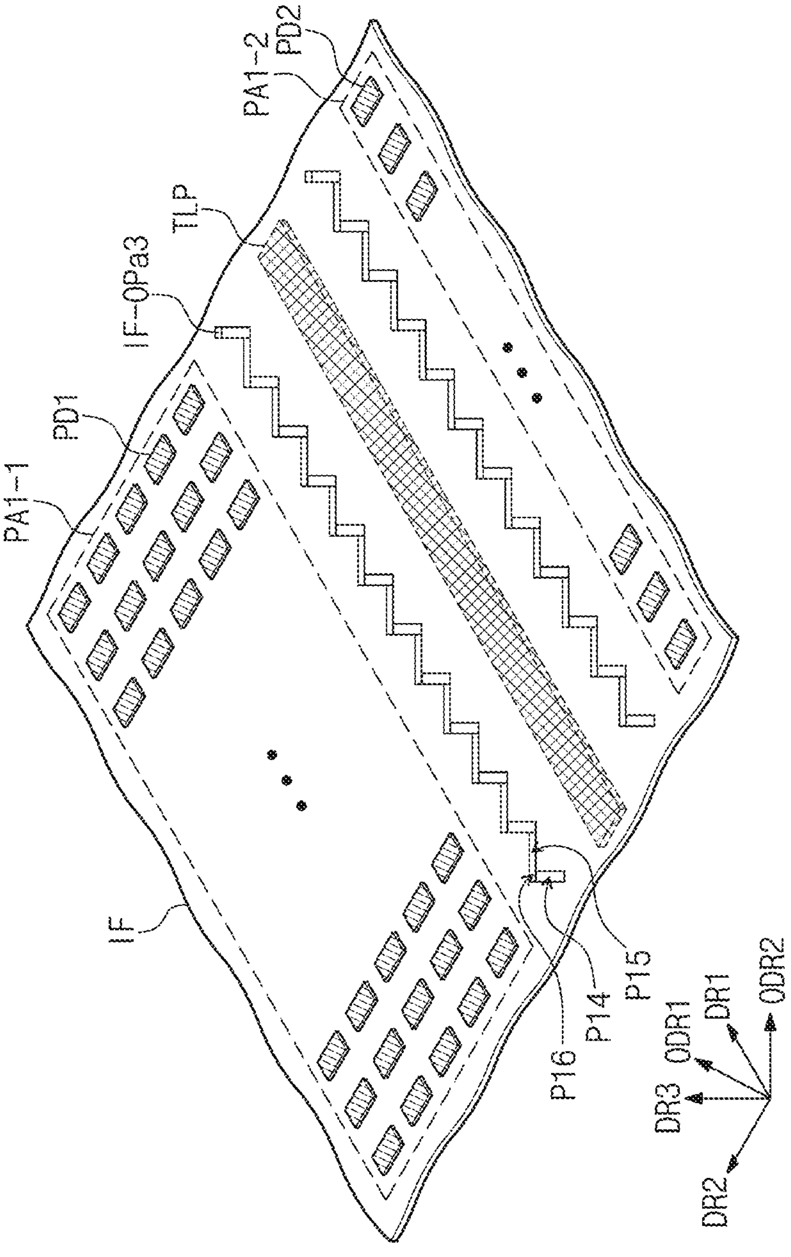
FIG. 10C is a perspective view illustrating a portion of the display device according to an embodiment.

Referring to FIG. 10C, the third opening IF-OPa3 may include a first portion P14, a second portion P15, and an intersection P16. The first portion P14 may extend in a first extension direction ODR1. The second portion P15 may extend in a second extension direction ODR2. The intersection P16 may be a portion disposed between the first portion P14 and the second portion P15.

In a plan view, the first extension direction ODR1 may be a direction intersecting the first direction DR1 and the second direction DR2, and the first extension direction ODR1 may be a direction inclined with respect to the first direction DR1 and the second direction DR2. The second extension direction ODR2 may intersect the first extension direction ODR1. The plane defined by the first extension direction ODR1 and the second extension direction ODR2 may be parallel to the plane defined by the first direction DR1 and the second direction DR2.

The first portion P14, the second portion P15, and the intersection P16 may have an integrated shape. The first portion P14, the intersection P16, and the second portion P15 may be alternately and repeatedly disposed. The first portion P14, the intersection P16, and the second portion P15 may have a shape of the letter V (or a shape of the letter V turned upside down). The third opening IF-OPa3 illustrated in FIG. 10C may have a shape in which the letter V and the upside-down letter V may be repeatedly arranged. Thus, in case of bending the bending area BA (see FIG. 4), stress occurring in the third opening IF-OPa3 may be minimized or prevented. In an embodiment, the third opening IF-OPa3, which may not be a single square shape, may minimize or prevent the stress generation in case of bending the bending area BA (see FIG. 4).

Figure 10D:
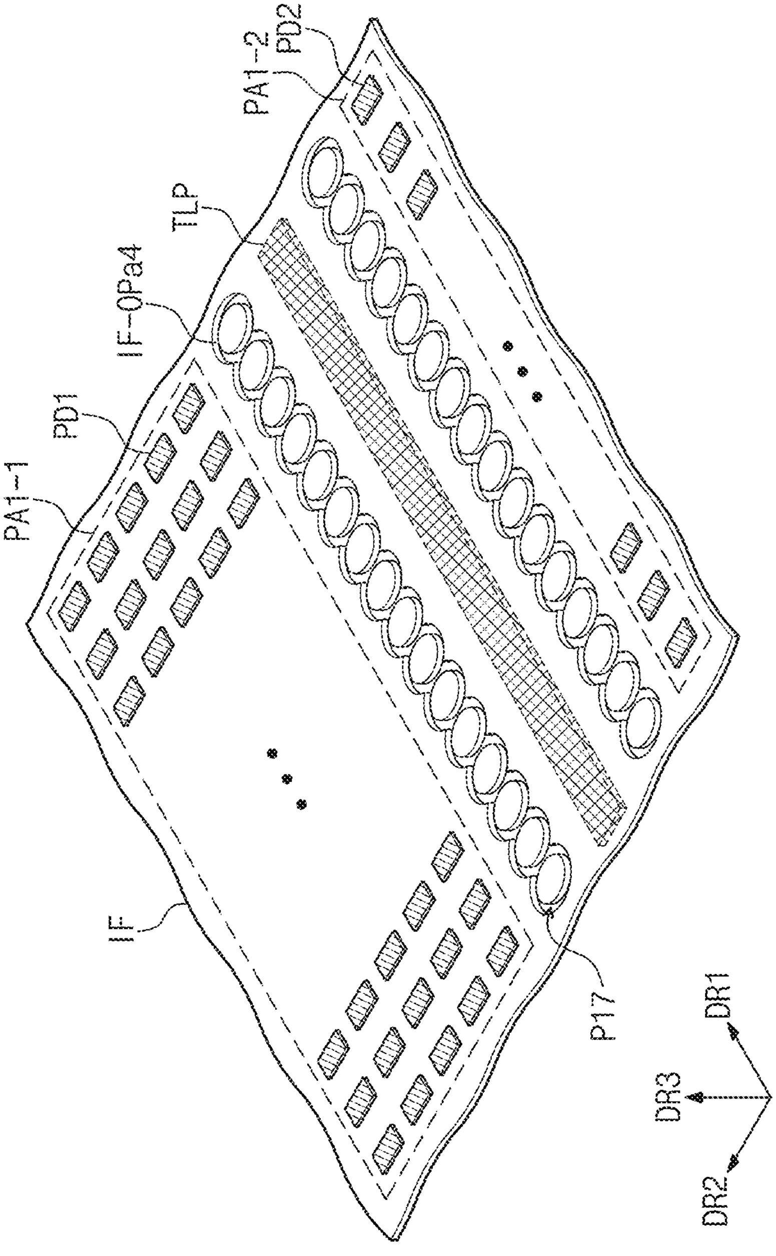
FIG. 10D is a perspective view illustrating a portion of the display device according to an embodiment.

Referring to FIG. 10D, the third opening IF-OPa4 may include a curved portion P17 having a curvature (e.g., predetermined or selectable curvature). In FIG. 10D, the third opening IF-OPa4 may be defined by multiple circular-shaped insulating layers IF. The third opening IF-OPa4 may be shaped like the number 8 (i.e., figure 8) rotated by an angle of about 90° and arranged continuously in the first direction DR1. Thus, in case of bending the bending area BA (see FIG. 4), the stress occurring in the third opening IF-OPa4 may be minimized. In an embodiment, the third opening IF-OPa4, which may not be a single square shape, may minimize or prevent the stress generation in case of bending the bending area BA (see FIG. 4).

Figure 10E:
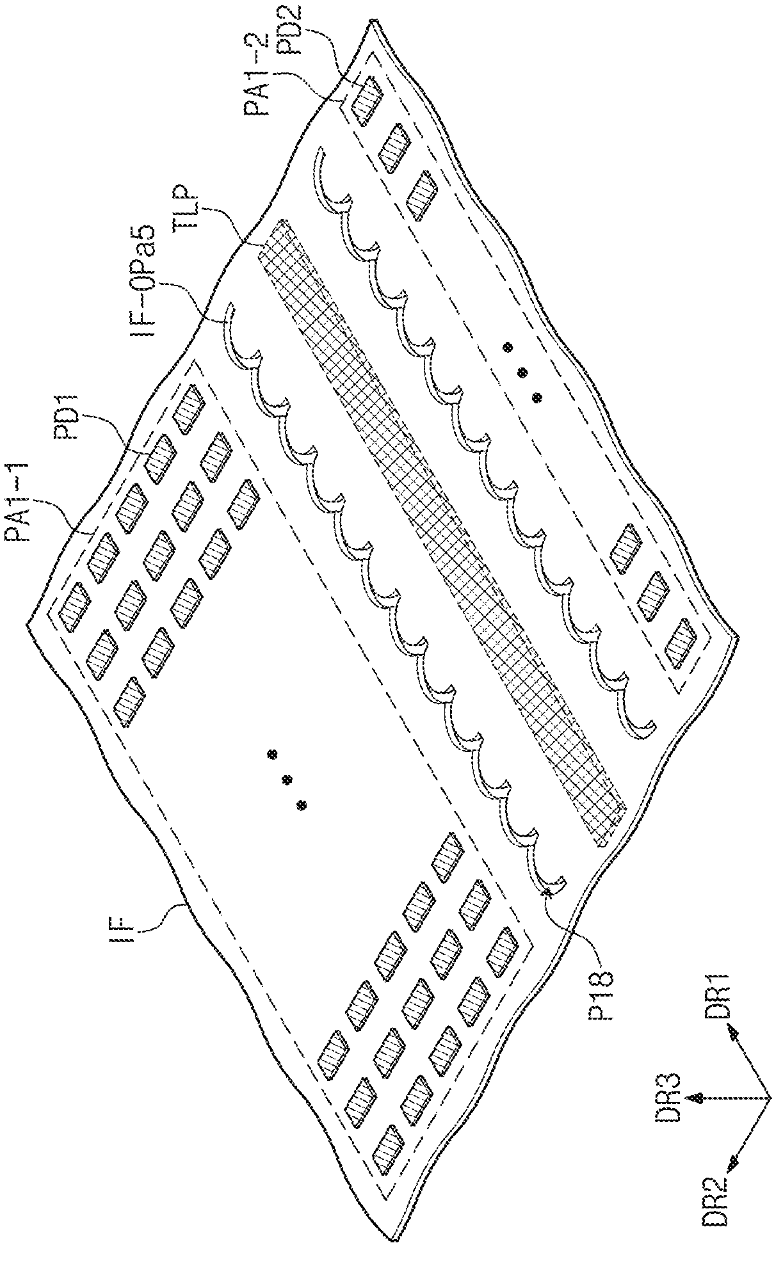
FIG. 10E is a perspective view illustrating a portion of the display device according to an embodiment.

Referring to FIG. 10E, the third opening IF-OPa5 may include a curved portion P18 having a curvature (e.g., predetermined or selectable curvature). The curved portion P18 may be shaped like a circumference of a semicircle or the letter C. In FIG. 10E, the third opening IF-OPa5 may have a shape in which the letter C may be rotated at an angle of about 90° in a clockwise direction and repeatedly arranged in the first direction DR1. Thus, in case of bending the bending area BA (see FIG. 4), the stress occurring in the third opening IF-OPa5 may be minimized or prevented. In an embodiment, the third opening IF-OPa5, which may not be a single square shape, may minimize or prevent the stress generation in case of bending the bending area BA (see FIG. 4).

Figure 10F:
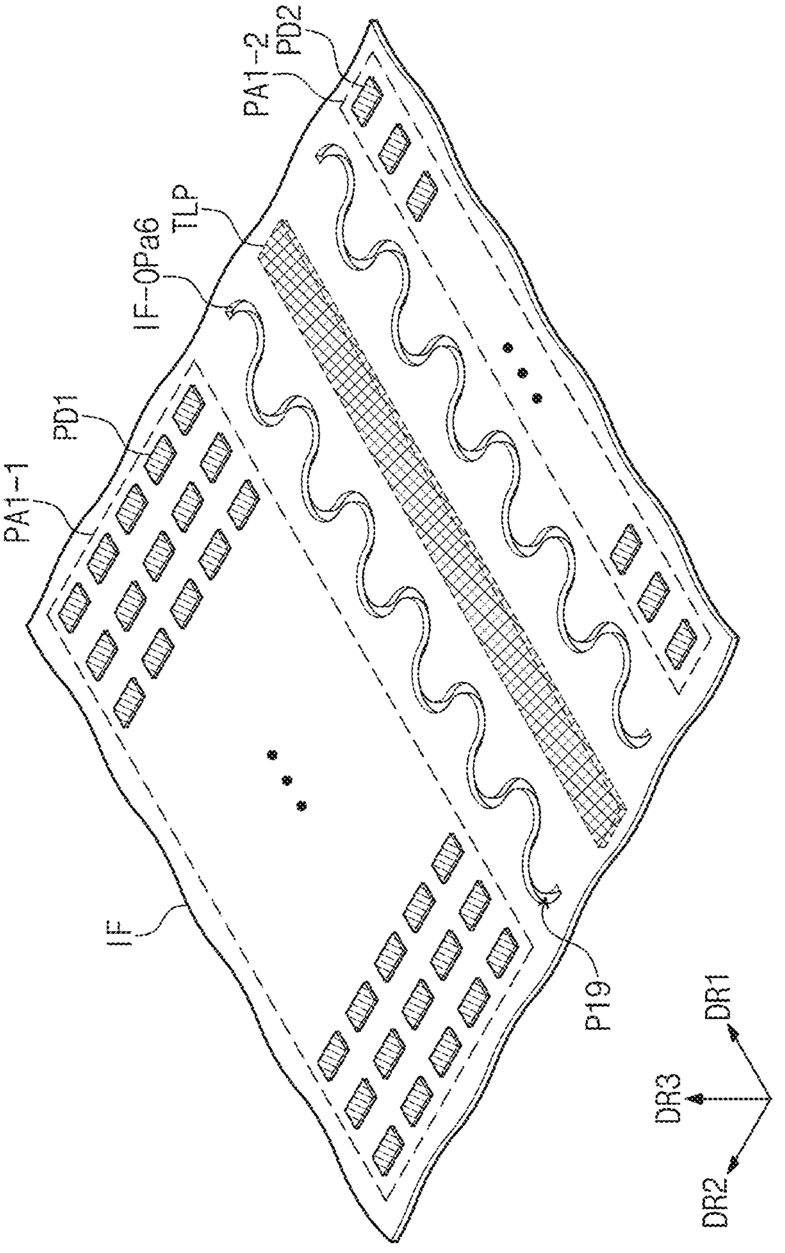
FIG. 10F is a perspective view illustrating a portion of the display device according to an embodiment.

Referring to FIG. 10F, the third opening IF-OPa6 may include a curved portion P19 having a curvature (e.g., predetermined or selectable curvature). The curved portion P19 may have a shape like the letter S. In FIG. 10F, the third opening IF-OPa6 may have a shape in which the letter S may be rotated at an angle of about 90° and repeatedly arranged in the first direction DR1. Thus, in case of bending the bending area BA (see FIG. 4), the stress occurring in the third opening IF-OPa6 may be minimized. In an embodiment, the third opening IF-OPa6, which may not be a single square shape, may minimize or prevent the stress generation in case of bending the bending area BA (see FIG. 4). The shapes of the third opening IF-OPa1, IF-OPa2, IF-OPa3, IF-OPa4, IF-OPa5, and IF-OPa6 illustrated in FIGS. 10A to 10F respectively may be illustrated as examples, and if the stress is minimized or prevented from occurring during the bending, the third opening may be transformed into any shape other than the single square shape.

Figure 11A:
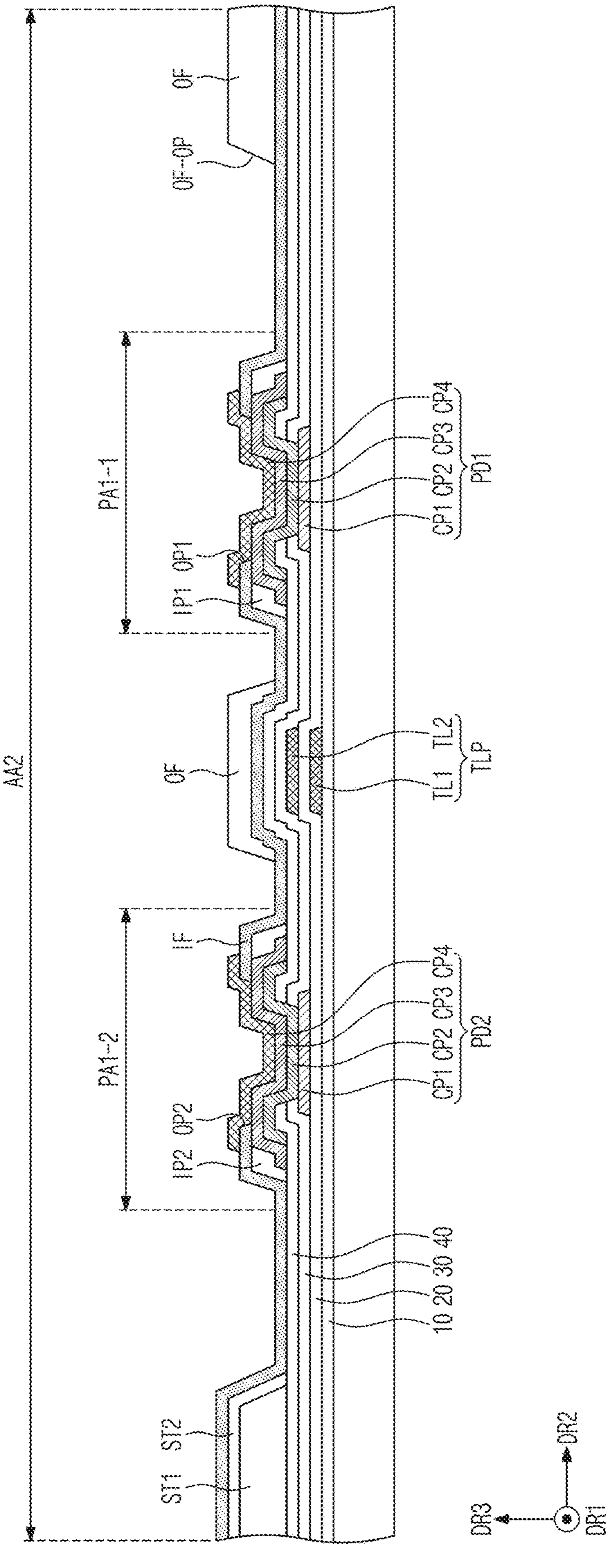
FIG. 11A is a schematic cross-sectional view illustrating a portion of the display device according to an embodiment.
Figure 11B:
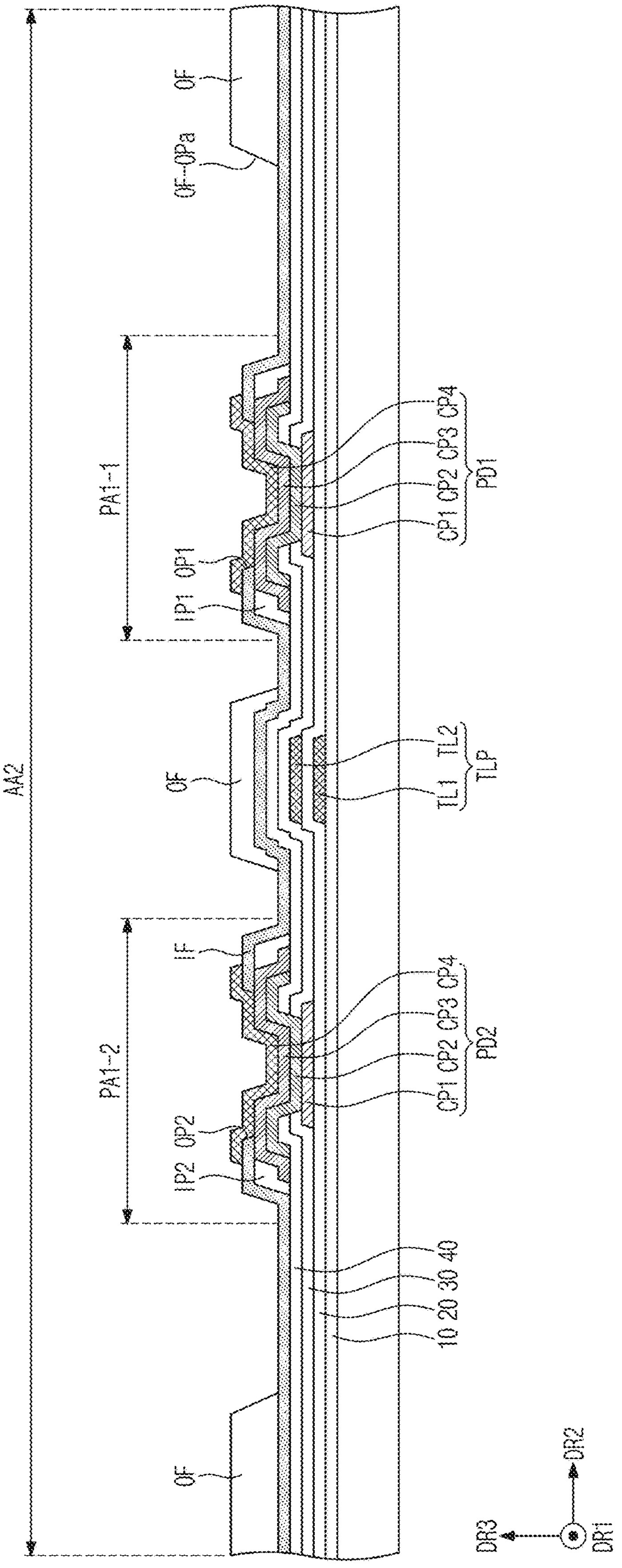
FIG. 11B is a schematic cross-sectional view illustrating a portion of the display device according to an embodiment.

FIGS. 11A and 11B are schematic cross-sectional views specifically illustrating the second base area AA2 of FIGS. 7A and 7B. Hereinafter, in describing FIGS. 11A and 11B, contents duplicated with those described with reference to FIGS. 1 to 10F will not be described again, and the differences will be explained.

Referring to FIGS. 11A and 11B, an organic protection layer OF may have protective openings OF-OP and OF-OPa defined therein. The protection openings OF-OP and OF-OPa may expose at least one of first and second signal pads PD1 and PD2.

Referring to FIG. 11A, the organic protection layer OF may have a protective opening OF-OP defined therein. The protection opening OF-OP may expose the first signal pad PD1. The organic protection layer OF may not overlap a first sub pad area PA1-1 and a second sub pad area PA1-2.

As described above, the organic protection layer OF and the sensing insulating layers IL2 and IL3 (see FIGS. 7A and 7B) or the optical layer RCL (see FIGS. 7A and 7B) of the input sensing layer ISP (see FIGS. 7A and 7B) may include a same organic material. The organic protection layer OF may be disposed on the insulating layer IF containing the inorganic material, and thus, even if the organic protection layer OF may expand, it may not affect the insulating layer IF. Since the square-shaped opening extending in a direction may not be defined in the insulating layer IF, the occurrence of the cracks due to the bending of the bending area BA (see FIG. 4) may be prevented. Thus, the display device EA (see FIG. 2) according to an embodiment may exhibit excellent reliability.

The display device EA (see FIG. 2) may further include a first sub organic pattern ST1 and a second sub organic pattern ST2 disposed on the second base area AA2. In the second base area AA2, the first sub organic pattern ST1 and the second sub organic pattern ST2 may be spaced apart from the first signal pad PD1 with the second signal pad PD2 disposed therebetween. The second sub organic pattern ST2 may be disposed on the first sub organic pattern ST1. An insulating layer IF may be disposed on the second sub organic pattern ST2.

The first sub organic pattern ST1 and the second sub organic pattern ST2 may be disposed up to an area outside the second sub pad area PA1-2. An outer area of the second sub pad area PA1-2 may mean an area that may be spaced apart from the first sub pad area PA1-1 and may be away from the second sub pad area PA1-2 in a direction perpendicular to the thickness direction DR3. The first and second sub organic patterns ST1 and ST2 disposed to the outer area of the second signal pad PD2 may not overlap the second pad area PA2 (see FIG. 6).

For example, the first sub organic pattern ST1 and the fifth insulating layer 50 may be formed at a same time. After forming an insulating layer on the fourth insulating layer 40 through a process such as deposition, coating, or printing, the insulating layer may be patterned to form the fifth insulating layer 50 and the first sub organic pattern ST1. Thereafter, the second sub organic pattern ST2 may be disposed on the first sub organic pattern ST1. After forming the first and second sub organic patterns ST1 and ST2, an insulating layer IF may be formed.

For example, the second sub organic pattern ST2 and the sixth insulating layer 60 may be formed at a same time. After forming an insulating layer on the fifth insulating layer 50 and the third conductive patterns CP3 of the first and second signal pads PD1 and PD2 through a process such as deposition, coating, or printing, the insulating layer may be patterned to form the sixth insulating layer 60, the first and second insulating patterns IP1 and IP2, and the second sub organic pattern ST2. The second sub organic pattern ST2 and the sixth insulating layer 60 may include a same material.

Referring to FIG. 11B, the organic protection layer OF may have a protective opening OF-OPa defined therein. In comparison to FIG. 11A, the protection opening OF-OPa in FIG. 11B may be different in that it exposes the first signal pad PD1 and the second signal pad PD2. In comparison to FIG. 11A, there may be a difference in that the first sub organic pattern ST1 and the second sub organic pattern ST2 may not be illustrated in FIG. 11B.

The organic protection layer OF having the protective opening OF-OPa defined therein to expose the second signal pad PD2 may be disposed to an area outside the second sub pad area PA1-2. The organic protection layer OF disposed to the outer area of the second signal pad PD2 may not overlap the second pad area PA2 (see FIG. 6).

Figure 12A:
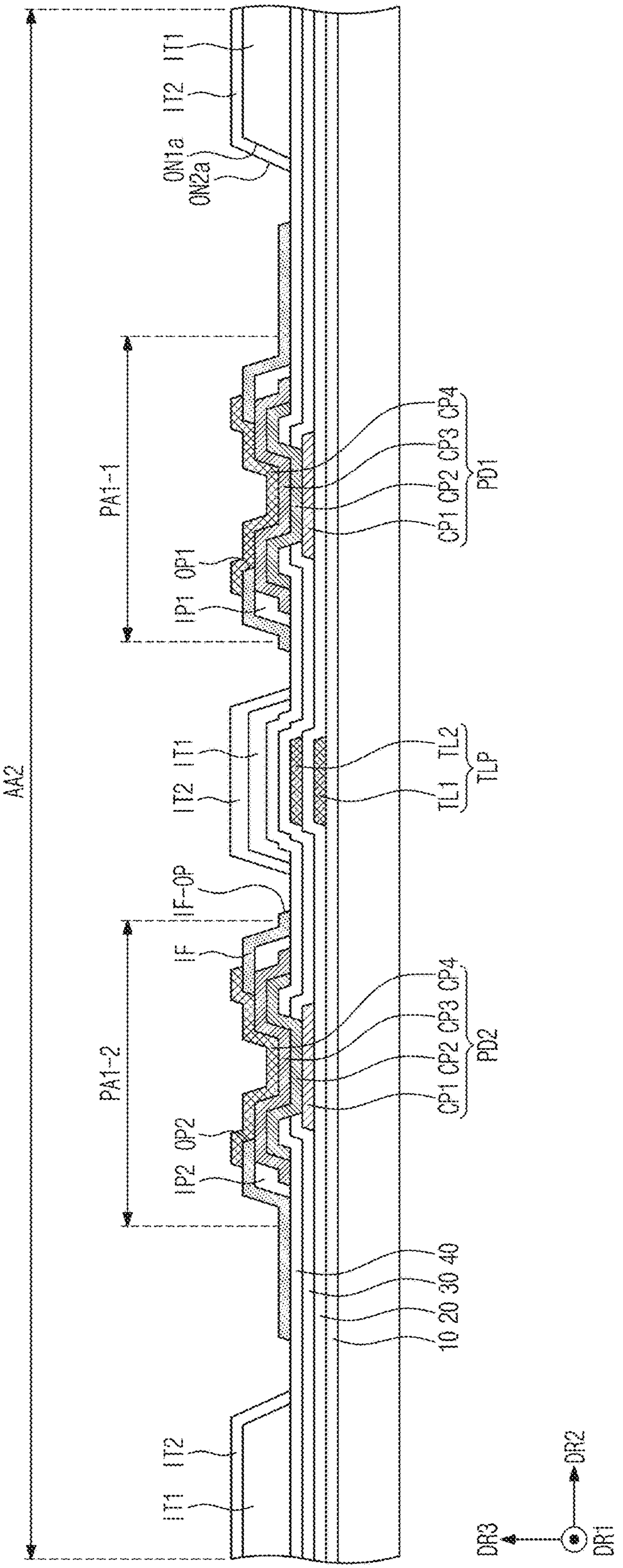
FIG. 12A is a schematic cross-sectional view illustrating a portion of the display device according to an embodiment.
Figure 12B:
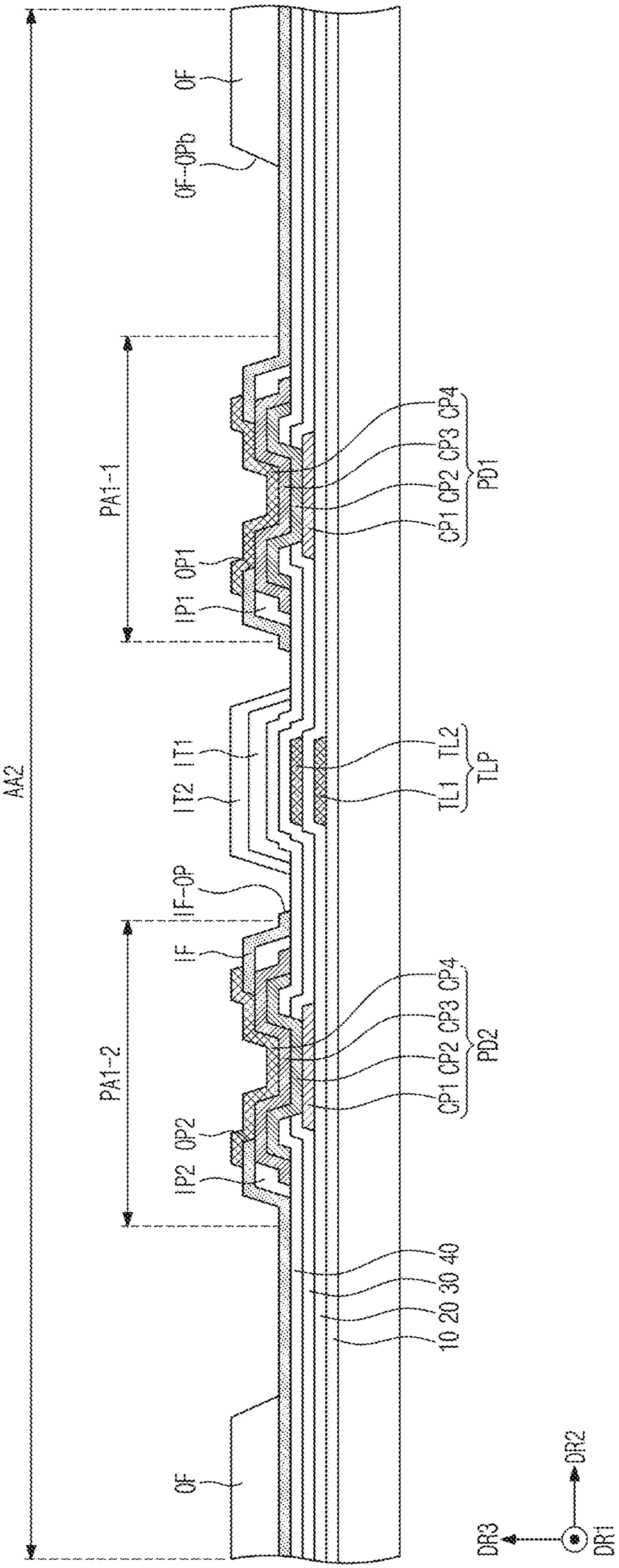
FIG. 12B is a schematic cross-sectional view illustrating a portion of the display device according to an embodiment.

FIGS. 12A and 12B are schematic cross-sectional views specifically illustrating the second base area AA2 of FIG. 8A. Hereinafter, in describing FIGS. 12A and 12B, contents duplicated with those described with reference to FIGS. 1 to 11B will not be described again, and the differences will be explained.

Referring to FIG. 12A, the first and second organic patterns IT1 and IT2 may have protection openings ON1*a* and ON2*a* defined therein. The first organic pattern IT1 may have a first protection opening ON1*a* defined therein, and the second organic pattern IT2 may have a second protection opening ON2*a* defined therein. The first protection opening ON1*a* may overlap the first and second openings OP1 and OP2. The second protection opening ON2*a* may overlap the first and second openings OP1 and OP2.

The first and second organic patterns IT1 and IT2, in which the protection openings ON1*a* and ON2*a* may be respectively defined, may be disposed up to an area outside the first sub pad area PA1-1 and an area outside the second sub pad area PA1-2. An outer area of the first sub pad area PA1-1 may mean an area that may be spaced apart from the second sub pad area PA1-2 and may be away from the first sub pad area PA1-1 in a direction perpendicular to the thickness direction. The first and second organic patterns IT1 and IT2 disposed to the outer area of the first sub pad area PA1-1 may not overlap the bending area BA (see FIG. 4). The first and second organic patterns IT1 and IT2 disposed to the outer area of the second sub pad area PA1-2 may not overlap the second pad area PA2 (see FIG. 6).

As described above, the insulating layer IF may have a third opening IF-OP defined therein to expose the organic patterns IT1 and IT2 disposed on the lighting circuit part TLP. The insulating layer IF may be spaced apart from the organic patterns IT1 and IT2 disposed on the outer area of the first sub pad area PA1-1 and the outer area of the second sub pad area PA1-2. The display device EA (see FIG. 2) including the organic patterns IT1 and IT2 and the insulating layer IF spaced apart from each other may exhibit excellent reliability.

Referring to FIG. 12B, the organic protection layer OF may have a protective opening OF-OPb defined therein. The protective opening OF-OPb may overlap the first and second openings OP1 and OP2. The first signal pad PD1, the second signal pad PD2, and the organic patterns IT1 and IT2 may be exposed through the protection opening OF-OPb.

The organic protection layer OF, which defines the protective opening OF-OPb exposing the first signal pad PD1, the second signal pad PD2, and the organic patterns IT1 and IT2, may be disposed up to an outer area of the first sub pad area PA1-1 and an outer area of the second sub pad area PA1-2. The organic protection layer OF disposed to the outer area of the first sub pad area PA1-1 may not overlap the bending area BA (see FIG. 4). The organic protection layer OF disposed to the outer area of the second sub pad area PA1-2 may not overlap the second pad area PA2 (see FIG. 6).

Figure 13:
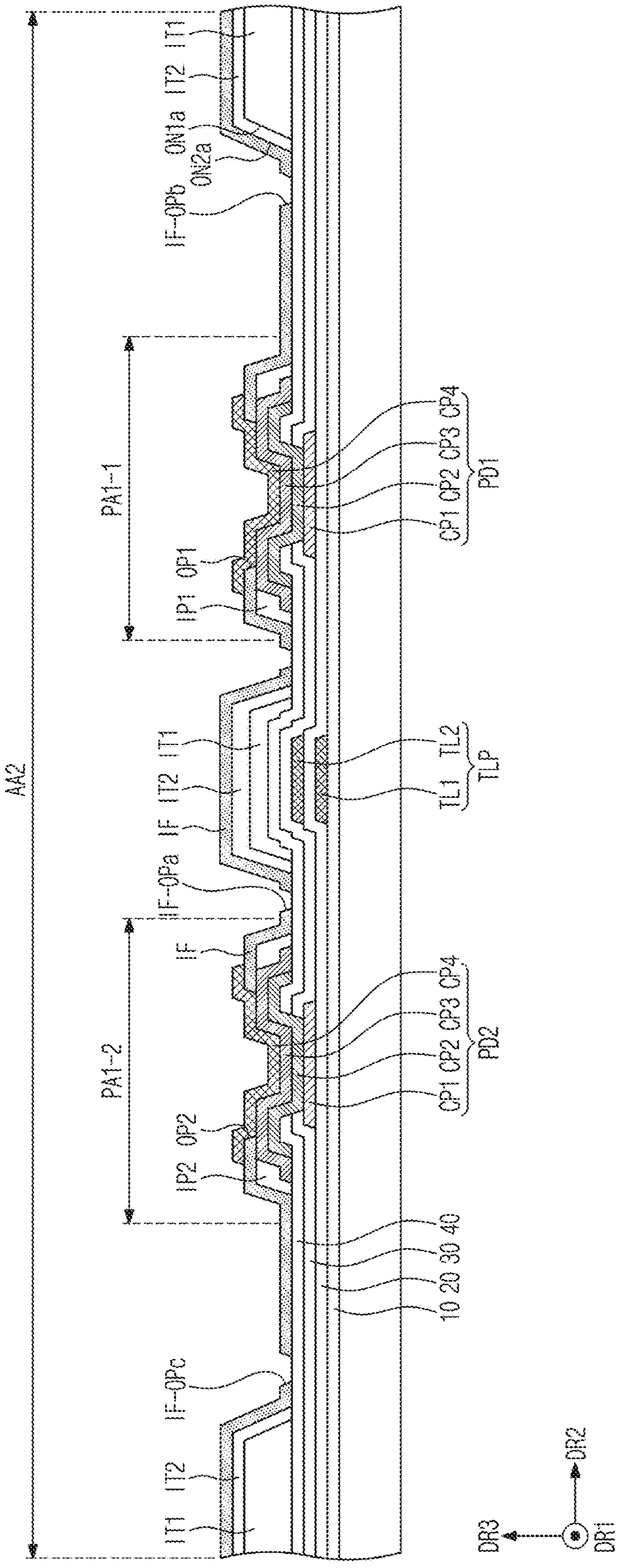
FIG. 13 is a schematic cross-sectional view illustrating a portion of the display device according to an embodiment.

FIG. 13 is a schematic cross-sectional view specifically illustrating the second base area AA2 of FIG. 9. Hereinafter, in describing FIG. 13, contents duplicated with those described with reference to FIGS. 1 to 12B will not be described again, and the differences will be explained.

Referring to FIG. 13, the insulating layer IF may cover the first and second organic patterns IT1 and IT2, and the fourth and fifth openings IF-OPb and IF-OPc may be further defined. The fourth opening IF-OPb may be spaced apart from the third opening IF-OPa with the first opening OP1 therebetween. The fifth opening IF-OPc may be spaced apart from the third opening IF-OPa with the second opening OP2 therebetween.

The fourth opening IF-OPb may be defined between the first signal pad PD1 and the first and second organic patterns IT1 and IT2. The fifth opening IF-OPc may be defined between the first and second organic patterns IT1 and IT2 and the second signal pad PD2.

As the fourth and fifth openings IF-OPb and IF-OPc may be defined in the insulating layer IF, moisture and oxygen may not be introduced into the first and second signal pads PD1 and PD2. In the insulating layer IF, a portion overlapping the first and second signal pads PD1 and PD2 and a portion covering the first and second organic patterns IT1 and IT2 may be disposed at a portion disconnected or spaced apart due to the fourth and fifth openings IF-OPb and IF-OPc, and thus, even if a gap occurs, the moisture and oxygen may not be introduced into the first and second signal pads PD1 and PD2. Thus, the display device EA (see FIG. 2) according to an embodiment including the insulating layer IF with the fourth and fifth openings IF-OPb and IF-OPc defined therein may exhibit excellent reliability.

FIGS. 14A to 14F are plan views illustrating constituents illustrated in FIG. 13, and only some of the constituents may be illustrated for convenience of explanation. The fourth opening IF-OPb illustrated in FIG. 13 and one of the fourth opening IF-OPb1, IF-OPb2, IF-OPb3, IF-OPb4, IF-OPb5, and IF-OPb6 illustrated in FIGS. 14A to 14F respectively may have a same shape. The fifth opening IF-OPc illustrated in FIG. 13 and one of the fifth opening IF-OPc1, IF-OPc2, IF-OPc3, IF-OPc4, IF-OPc5, and IF-OPc6 illustrated in FIGS. 14A to 14F respectively may have a same shape. Hereinafter, in describing FIGS. 14A to 14F, contents duplicated with those described with reference to FIGS. 1 to 13 will not be described again, and differences will be described.

Referring to FIGS. 14A to 14F, fourth openings IF-OPb1, IF-OPb2, IF-OPb3, IF-OPb4, IF-OPb5, and IF-OPb6 respectively may be defined in an outer area of the first signal pad PD1. The fifth openings IF-OPc1, IF-OPc2, IF-OPc3, IF-OPc4, IF-OPc5, and IF-OPc6 may be defined in an outer area of the second signal pad PD2. The fourth openings IF-OPb1, IF-OPb2, IF-OPb3, IF-OPb4, IF-OPb5, and IF-OPb6 and the fifth openings IF-OPc1, IF-OPc2, IF-OPc3, IF-OPc4, IF-OPc5, and IF-OPc6 respectively may be spaced apart from each other with the first and second signal pads PD1 and PD2 therebetween.

Figure 14A:
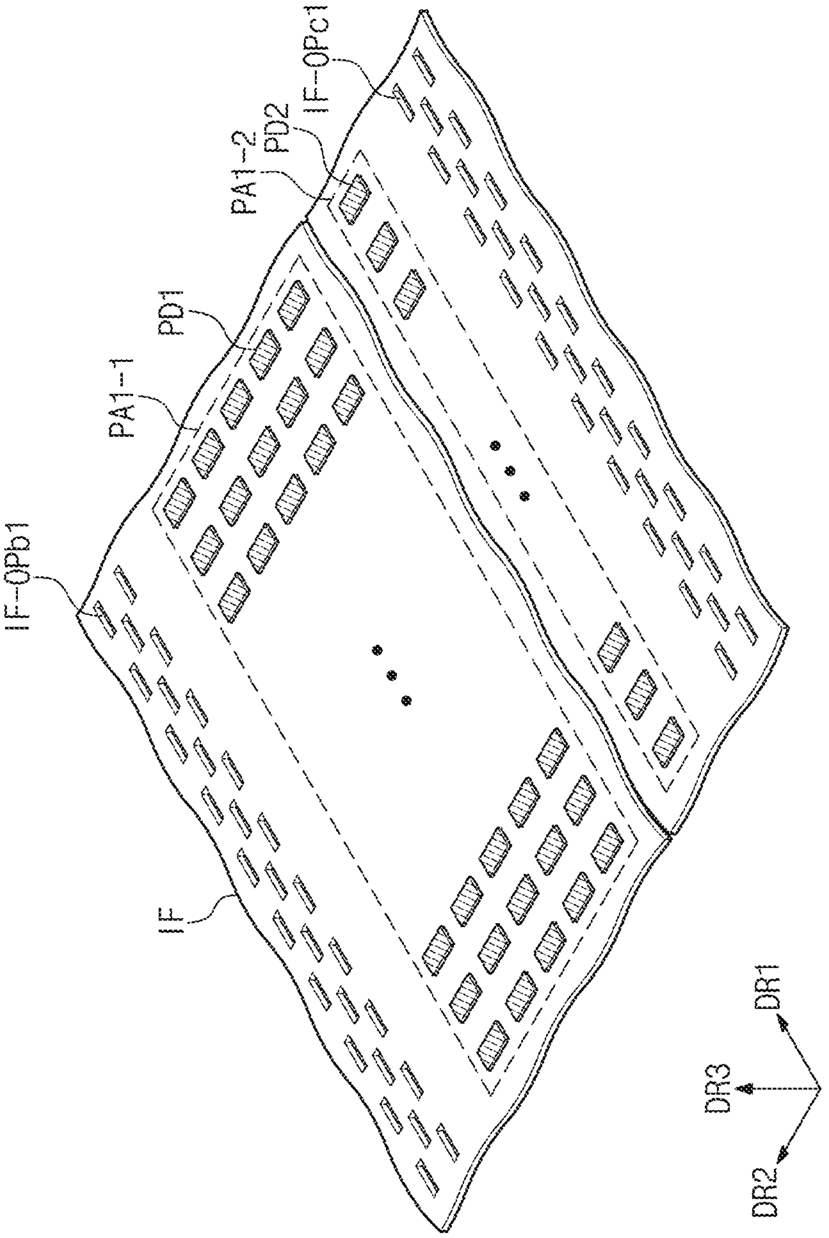
FIG. 14A is a perspective view illustrating a portion of the display device according to an embodiment.

Referring to FIG. 14A, each of the fourth opening IF-OPb1 and the fifth opening IF-OPc1 may be provided in multiple. Each of the fourth openings IF-OPb1 and the fifth openings IF-OPc1 may have a rectangular shape, and the rectangles may be arranged in a dotted line.

In the second direction DR2, each of the fourth openings IF-OPb1 and the fifth openings IF-OPc1 may be arranged in three rows. In each of the three rows, the fourth openings IF-OPb1 and the fifth openings IF-OPc1 may be spaced apart from each other in the first direction DR1. The fourth openings IF-OPb1 in the second row may not be aligned (i.e., may be staggered) with respect to the fourth openings IF-OPb1 in the first and third rows. The fifth openings IF-OPc1 in the second row may not be aligned (i.e., may be staggered) with respect to the fifth openings IF-OPc1 in the first and third rows.

That is, an inner surface defining the fourth opening IF-OPb1 in the second row may not be parallel to an inner surface defining the fourth opening IF-OPb1 in the first and third rows. The inner surface defining the fifth opening IF-OPc1 in the second row may not be aligned with the inner surface defining the fifth opening IF-OPc1 in the first and third rows. Thus, in case of bending the bending area BA (see FIG. 4), stress occurring in the fourth openings IF-OPb1 and the fifth openings IF-OPc1 may be minimized or prevented. In the related art, the fourth and fifth openings were provided in a single square shape, and in case of bending the bending area, a lot of stress was generated in the fourth and fifth openings to cause cracks. Unlike this, in an embodiment, the fourth opening IF-OPb1 and the fifth opening IF-OPc1 provided in the form of the dotted line may minimize or prevent the occurrence of the stress in case of bending the bending area BA (see FIG. 4).

Figure 14B:
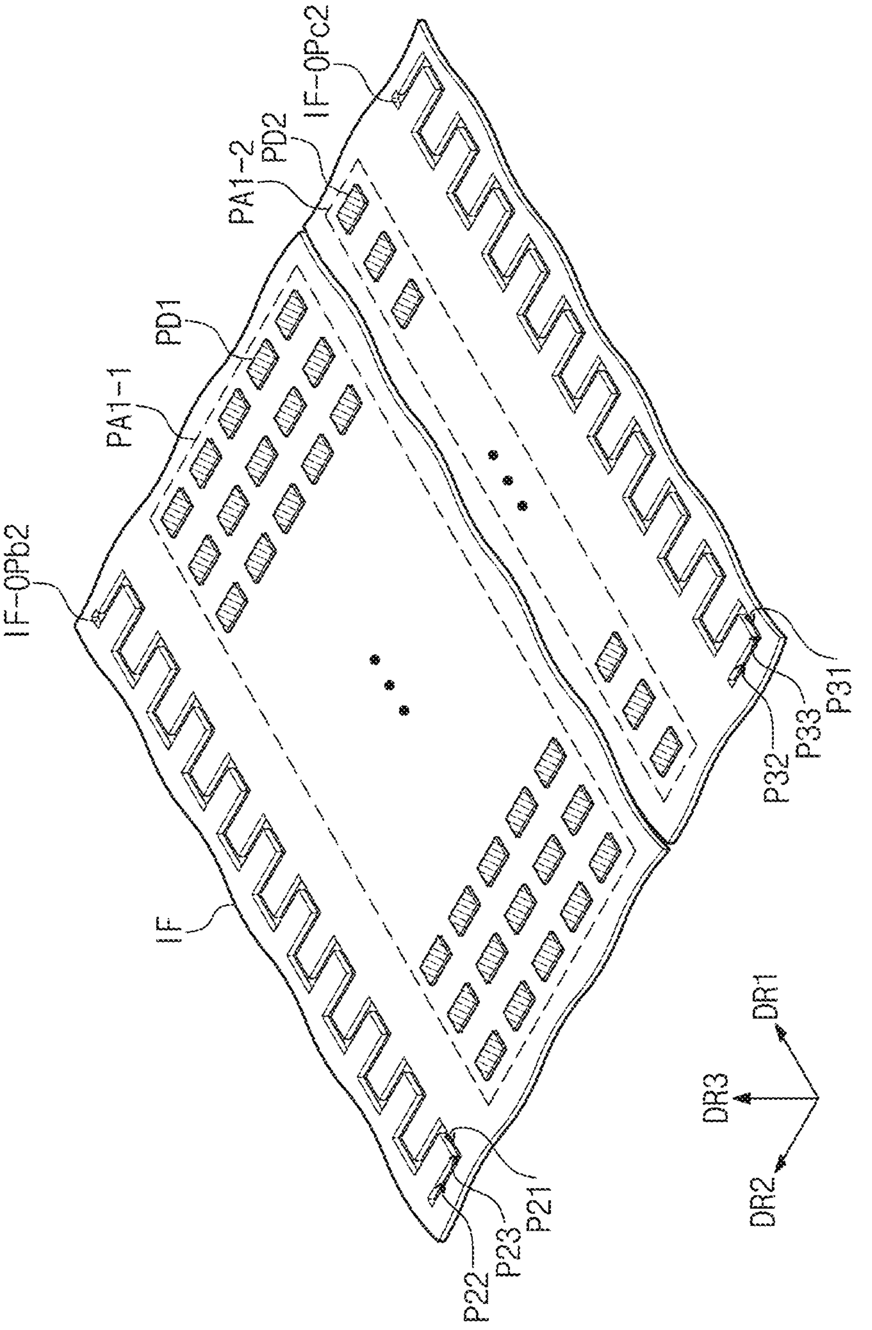
FIG. 14B is a perspective view illustrating a portion of the display device according to an embodiment.

Referring to FIG. 14B, each of the fourth opening IF-OPb2 and the fifth opening IF-OPc2 may include first sub portions P21 and P31, second sub portions P22 and P32, and sub intersections P23 and P33. Hereinafter, for convenience of explanation, the sub intersection P23 of the fourth opening IF-OPb2 will be referred to as a first sub intersection. The first sub portion P31 of the fifth opening IF-OPc2 may be referred to as a third sub portion, the second sub portion P32 of the fifth opening IF-OPc2 may be referred to as a fourth sub portion, and the sub intersection P33 of the fifth opening IF-OPc2 may be referred to as a second sub intersection.

Each of the first and third sub portions P21 and P31 may extend in the first direction DR1, and each of the second and fourth sub portions P22 and P32 may extend in the second direction DR2. The first sub intersection P23 may be a portion disposed between the first sub portion P21 and the second sub portion P22. The second sub intersection P33 may be a portion disposed between the third sub portion P31 and the fourth sub portion P32. In the fourth opening IF-OPb2, the first sub portion P21, the second sub portion P22, and the first sub intersection P23 may have an integrated shape. In the fifth opening IF-OPc2, the third sub portion P31, the fourth sub portion P32, and the second sub intersection P33 may have an integrated shape.

The first sub portion P21, the first sub intersection P23, and the second sub portion P22 may be alternately and repeatedly disposed. The one first sub portions P21 and two second sub portion P22 may have a shape of the letter U (or an upside down U shape in a plan view). The fourth opening IF-OPb2 illustrated in FIG. 14B may have a shape in which the letter U and the upside-down letter U may be repeatedly arranged.

The third sub portion P31, the second sub intersection P33, and the fourth sub portion P32 may be alternately and repeatedly disposed. The one third sub portions P31 and two fourth sub portion P32 may have a shape of the letter U (or an upside down U in a plan view). The fifth opening IF-OPc2 illustrated in FIG. 14B may have a shape in which the letter U and the upside-down letter U may be repeatedly arranged.

Thus, in case of bending the bending area BA (see FIG. 4), stress occurring in the fourth and fifth openings IF-OPb2 and IF-OPc2 may be minimized or prevented. In an embodiment, the fourth and fifth openings IF-OPb2 and IF-OPc2, which do not have a single square shape, may minimize the stress generation in case of bending the bending area BA (see FIG. 4).

Figure 14C:
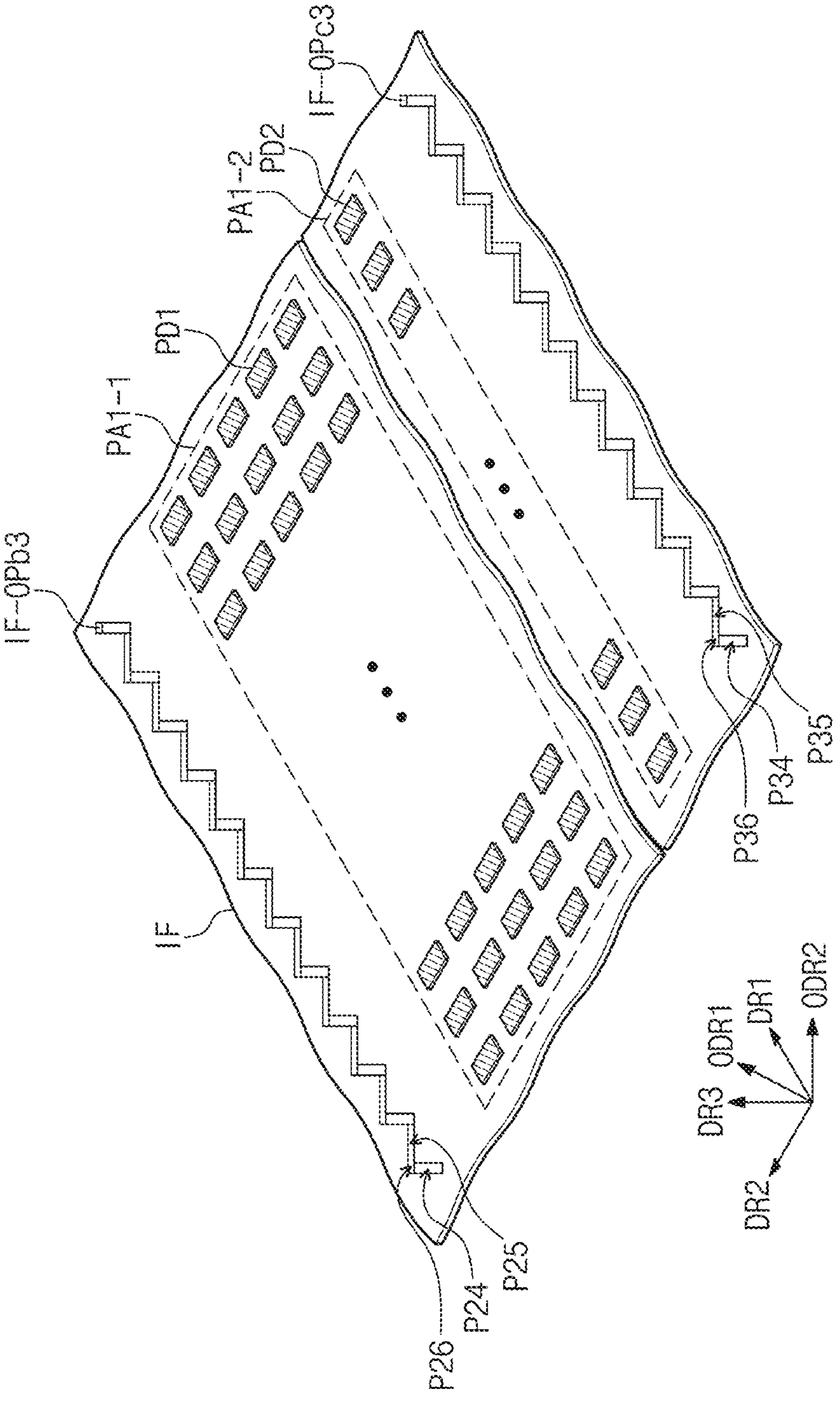
FIG. 14C is a perspective view illustrating a portion of the display device according to an embodiment.

Referring to FIG. 14C, each of the fourth and fifth openings IF-OPb3 and IF-OPc3 may include first sub portions P24 and P34, second sub portions P25 and P35, and sub intersections P26 and P36. Hereinafter, for convenience of explanation, the sub intersection P26 of the fourth opening IF-OPb3 may be referred to as a first sub intersection. The first sub portion P34 of the fifth opening IF-OPc3 may be referred to as a third sub portion, the second sub portion P35 of the fifth opening IF-OPc3 may be referred to as a fourth sub portion, and the sub intersection P36 of the fifth opening IF-OPc3 may be referred to as a second sub intersection.

Each of the first and third sub portions P24 and P34 may extend in a first extension direction ODR1. Each of the second and fourth sub portions P25 and P35 may extend in a second extension direction ODR2. The first sub intersection P26 may be a portion disposed between the first sub portion P24 and the second sub portion P25. The second sub intersection P36 may be a portion disposed between the third sub portion P34 and the fourth sub portion P35. The content described with reference to FIG. 10C may be equally applied to the first and second extension directions ODR1 and ODR2.

In the fourth opening IF-OPb3, the first sub portion P24, the second sub portion P25, and the first sub intersection P26 may have an integrated shape. The first sub portion P24, the first sub intersection P26, and the second sub portion P25 may be alternately and repeatedly disposed. The first sub portion P24, the first sub intersection P26, and the second sub portion P25 may have a shape of the letter V (or an upside down letter V).

In the fifth opening IF-OPc3, the third sub portion P34, the fourth sub portion P35, and the second sub intersection P36 may have an integrated shape. The third sub portion P34, the second sub intersection P36, and the fourth sub portion P35 may be alternately and repeatedly disposed. The third sub portion P34, the second sub intersection P36, and the fourth sub portion P35 may have a shape of the letter V (or an upside down letter V).

Each of the fourth and fifth openings IF-OPb3 and IF-OPc3 illustrated in FIG. 14C may have a shape in which the letter V and the inverted letter V may be repeatedly arranged. Thus, in case of bending the bending area BA (see FIG. 4), the stress occurring in the fourth and fifth openings IF-OPb3 and IF-OPc3 may be minimized or prevented. In an embodiment, the fourth and fifth openings IF-OPb3 and IF-OPc3, which do not have a single square shape, may minimize or prevent the stress generation in case of bending the bending area BA (see FIG. 4).

Figure 14D:
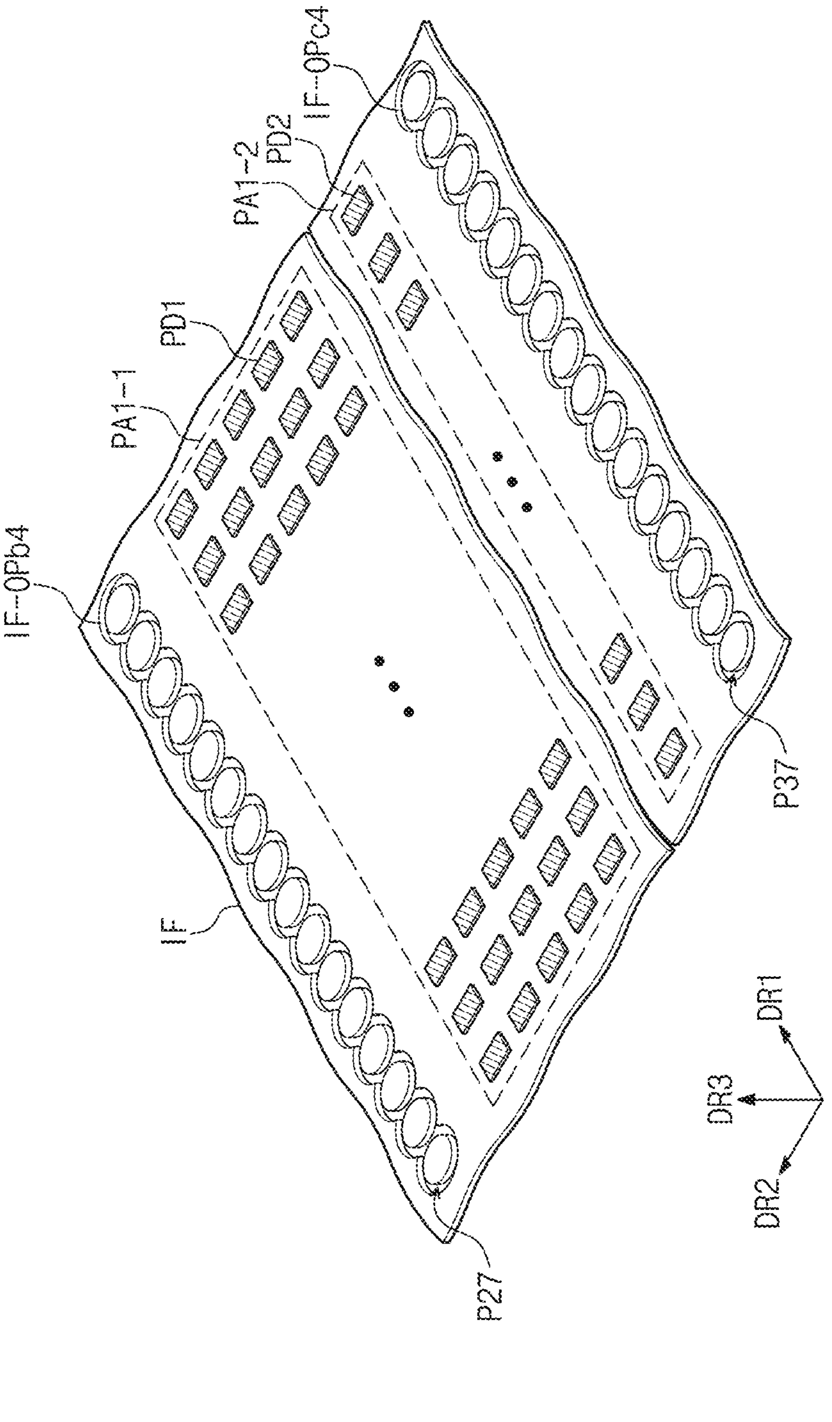
FIG. 14D is a perspective view illustrating a portion of the display device according to an embodiment.

Referring to FIG. 14D, each of the fourth and fifth openings IF-OPb4 and IF-OPc4 may include sub curved portions P27 and P37, each of which has a curvature (e.g., predetermined or selectable curvature). In FIG. 14D, each of the fourth and fifth openings IF-OPb4 and IF-OPc4 may be defined by multiple circular insulating layers IF. Each of the fourth and fifth openings IF-OPb4 and IF-OPc4 may have a shape in which the number 8 (or a figure 8) may be rotated at an angle of about 90° and arranged continuously in the first direction DR1. Thus, in case of bending the bending area BA (see FIG. 4), the stress occurring in the fourth and fifth openings IF-OPb4 and IF-OPc4 may be minimized. In an embodiment, the fourth and fifth openings IF-OPb4 and IF-OPc4, which do not have a single square shape, may minimize or prevent the stress generation in case of bending the bending area BA (see FIG. 4).

Figure 14E:
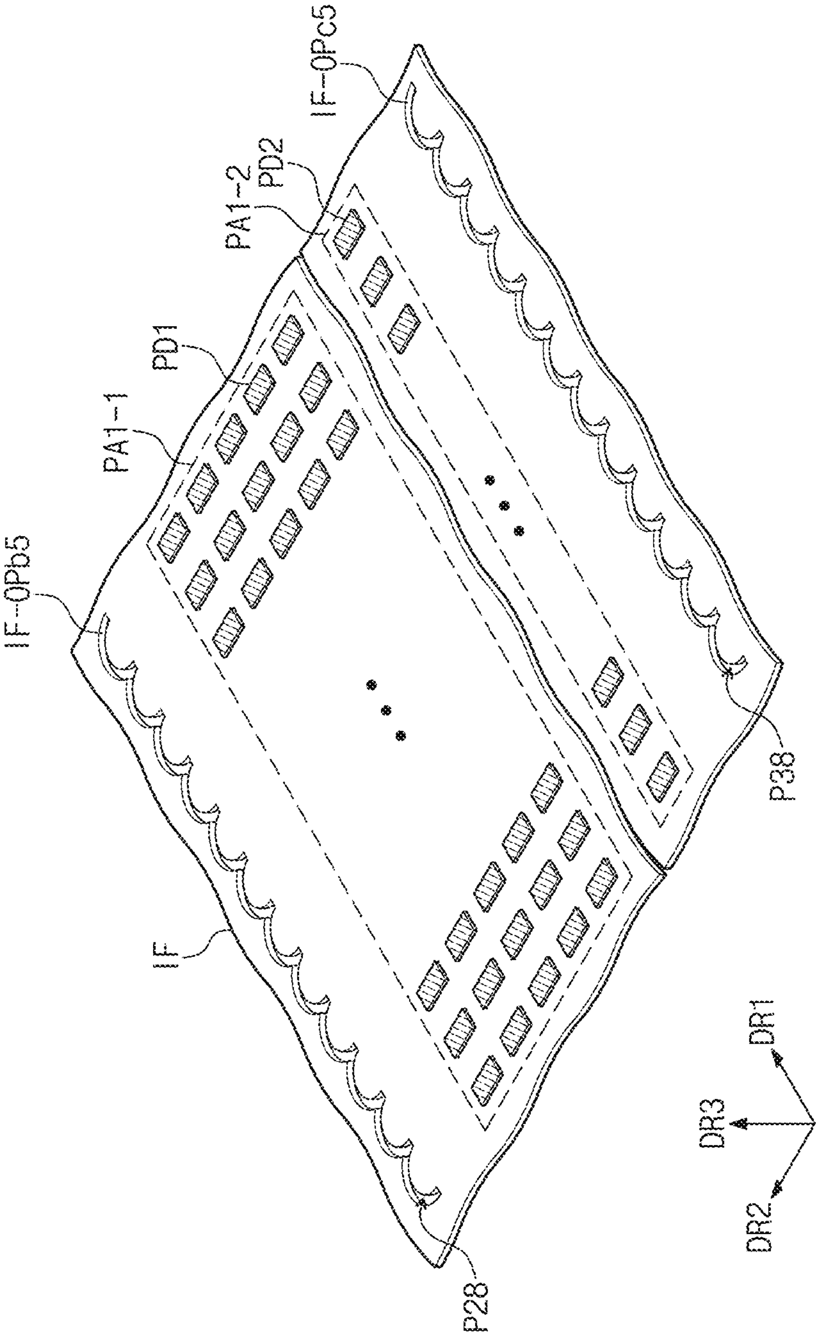
FIG. 14E is a perspective view illustrating a portion of the display device according to an embodiment.

Referring to FIG. 14E, each of the fourth and fifth openings IF-OPb5 and IF-OPc5 may include sub curved portions P28 and P38, each of which has a curvature (e.g., predetermined or selectable curvature). The curved portions P28 and P38 may be shaped like a circumference of a semicircle or the letter C. In FIG. 14E, each of the fourth and fifth openings IF-OPb5 and IF-OPc5 may have a shape in which the letter C may be rotated at an angle of about 90° in a clockwise direction and repeatedly arranged in the first direction DR1. Thus, in case of bending the bending area BA (see FIG. 4), the stress occurring in the fourth and fifth openings IF-OPb5 and IF-OPc5 may be minimized or prevented. In an embodiment, the fourth and fifth openings IF-OPb5 and IF-OPc5, which do not have a single square shape, may minimize or prevent the stress generation in case of bending the bending area BA (see FIG. 4).

Figure 14F:
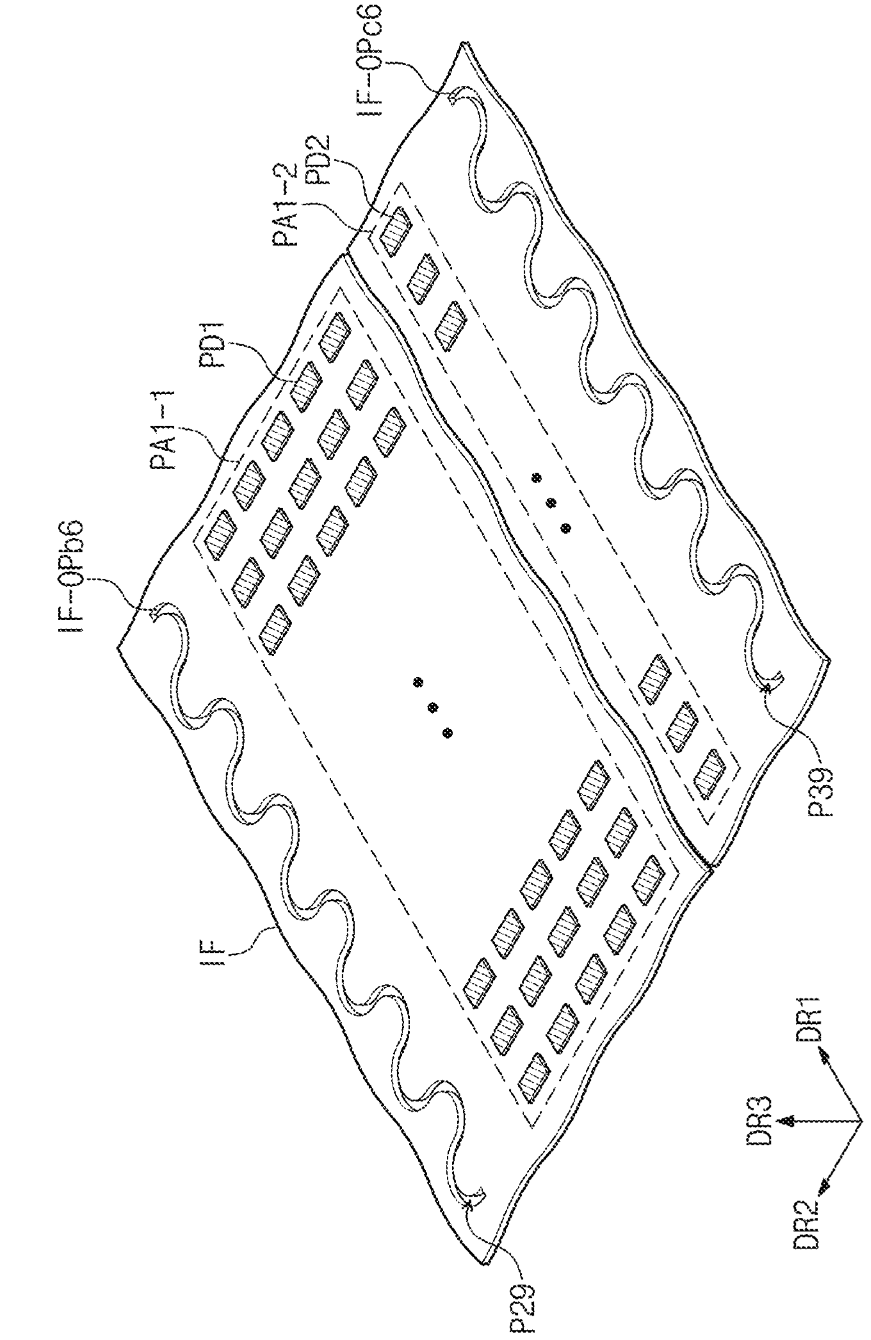
FIG. 14F is a perspective view illustrating a portion of the display device according to an embodiment.

Referring to FIG. 14F, each of the fourth and fifth openings IF-OPb6 and IF-OPc6 may include sub curved portions P29 and P39, each of which has a curvature (e.g., predetermined or selectable curvature). Each of the sub curved portions P29 and P39 may have a shape like the letter S. In FIG. 14F, each of the fourth and fifth openings IF-OPb6 and IF-OPc6 may have a shape in which the letter S may be rotated at an angle of about 90° and repeatedly arranged in the first direction DR1. Thus, in case of bending the bending area BA (see FIG. 4), the stress occurring in the fourth and fifth openings IF-OPb6 and IF-OPc6 may be minimized. In an embodiment, the fourth and fifth openings IF-OPb6 and IF-OPc6, which do not have a single square shape, may minimize or prevent the stress generation in case of bending the bending area BA (see FIG. 4). The shapes of the fourth and fifth openings IF-OPb1 to IF-OPb6 and IF-OPc1 to IF-OPc6 illustrated in FIGS. 14A to 14F may be illustrated as examples, and if the stress may be minimized or prevented from occurring during the bending, the fourth and fifth openings may be transformed into any shape other than the single square shape.

The display device according to an embodiment may include the light emitting element disposed on the display area, the first signal pad disposed in the non-display area, and the second signal pad disposed on the non-display area. The display device may include the insulating layer overlapping the edges of the first and second signal pads, the lighting circuit part disposed between the first signal pad and the second signal pad, and the organic protection layer overlapping the lighting circuit part. The organic protection layer and one of the input sensing layer or optical layer disposed on the light emitting element may include a same organic material. As the organic protection layer may be disposed on the upper portion of the insulating layer containing the inorganic material, even in case of the organic protection layer containing the organic material is deformed, the insulating layer may not be affected. Thus, the display device according to an embodiment may exhibit excellent reliability.

The display device according to an embodiment may include the organic pattern disposed on the lighting circuit part and the insulating layer in which the third opening may be defined. The third opening may overlap the lighting circuit part, and the organic pattern may be exposed through the third opening. Since the insulating layer has the third opening defined therein to expose the organic patterns and may be spaced apart from the organic patterns, the deformation of the organic protection layer may not affect the insulating layer. Thus, the display device according to an embodiment may exhibit excellent reliability.

The display device according to an embodiment may include the organic pattern disposed on the lighting circuit part and the insulating layer covering the organic pattern. The third opening defined in the insulating layer may not overlap the first and second signal pads, and thus, even if the organic pattern may be lifted, the insulating layer may not be affected. In a plan view, the third opening may be provided in multiple short rectangular shapes (i.e., dotted line shapes) or may be provided in the shape including the intersection or the curved portion. Since the third opening does not have the single square shape, the stress occurring in the opening in case of the display panel is bent may be minimized or prevented. Thus, the display device according to an embodiment may exhibit excellent reliability.

The display device according to the embodiment may the organic protection layer configured to protect the lighting circuit part and disposed on the insulating layer to exhibit the excellent reliability.

As another example, the display device according to the embodiment may exhibit the excellent reliability by defining the opening in the insulating layer that does not overlap the signal pad.

It will be apparent to those skilled in the art that various modifications and deviations can be made in the inventive concept. Thus, it may be intended that the inventive concept covers the modifications and deviations of this invention provided they come within the scope of the appended claims and their equivalents.

Therefore, the technical scope of the invention may not be limited to the contents described in the detailed description of the specification, but should be determined by the claims.

What is claimed is:

1. A display device comprising:
- a light emitting element disposed in a display area;
- a first signal pad electrically connected to the light emitting element and disposed in a non-display area adjacent to the display area;
- a second signal pad disposed in the non-display area, the first signal pad being disposed between the display area and the second signal pad;
- an insulating layer overlapping an edge of the first signal pad and an edge of the second signal pad and disposed in the non-display area;
- a lighting circuit part disposed between the first signal pad and the second signal pad in the non-display area; and
- an organic protection layer overlapping the lighting circuit part,
- wherein the insulating layer is disposed between the lighting circuit part and the organic protection layer.

2. The display device of claim 1, wherein the organic protection layer does not overlap the first signal pad and the second signal pad.

3. The display device of claim 1, wherein a protection opening through which at least one of the first signal pad and the second signal pad is exposed is defined in the organic protection layer.

4. The display device of claim 1, further comprising:
- an input sensing layer disposed on the light emitting element and comprising a sensing conductive layer and a sensing insulating layer disposed on the sensing conductive layer,
- wherein the organic protection layer and the sensing insulating layer comprise a same organic material.

5. The display device of claim 1, further comprising:
- an optical layer comprising at least one of a dye or a pigment and disposed on the light emitting element,
- wherein the organic protection layer and the optical layer comprise a same organic material.

6. The display device of claim 5, wherein
- the optical layer comprises:
  - an optical pattern part in which a pattern opening is defined; and
  - a light control layer disposed in the pattern opening, the light control layer comprising at least one of the dye and the pigment, and the light control layer being a planarization layer, and
- the organic protection layer and the light control layer comprise a same organic material.

7. The display device of claim 5, wherein
the optical layer comprises:
an optical pattern part in which a pattern opening is defined;
a filter part in the pattern opening, the filter part comprising at least one of the dye and the pigment; and
an overcoat layer disposed on the optical pattern part and the filter part, and the organic protection layer and the overcoat layer comprise a same organic material.

8. The display device of claim 7, wherein
the light emitting element comprises a first electrode, a second electrode disposed on the first electrode, and an emission layer disposed between the first electrode and the second electrode, and
the filter part overlaps the emission layer.

9. The display device of claim 1, wherein the insulating layer comprises:
a first opening through which the first signal pad is exposed; and
a second opening through which the second signal pad is exposed.

10. The display device of claim 1, wherein
the lighting circuit part comprises an inspection line, and
the inspection line and at least one of the first signal pad and the second signal pad are disposed on a same layer.

11. The display device of claim 1, further comprising:
a first insulating pattern disposed to correspond to the edge of the first signal pad; and
a second insulating pattern disposed to correspond to the edge of the second signal pad,
wherein the insulating layer is disposed on the first insulating pattern and the second insulating pattern.

12. A display device comprising:
a light emitting element disposed in a display area;
a first signal pad electrically connected to the light emitting element and disposed in a non-display area adjacent to the display area;
a second signal pad disposed in the non-display area, the first signal pad being disposed between the display area and the second signal pad;
an insulating layer overlapping an edge of the first signal pad and an edge of the second signal pad and disposed in the non-display area;
a lighting circuit part disposed between the first signal pad and the second signal pad in the non-display area; and
an organic protection layer disposed on the lighting circuit part,
wherein the insulating layer comprises:
a first opening through which the first signal pad is exposed;
a second opening through which the second signal pad is exposed; and
at least one third opening disposed between the first opening and the second opening.

13. The display device of claim 12, wherein the at least one third opening overlaps the lighting circuit part.

14. The display device of claim 12, wherein the organic protection layer is exposed through the at least one third opening.

15. The display device of claim 12, wherein the at least one third opening is defined between the first signal pad and the lighting circuit part and between the lighting circuit part and the second signal pad.

16. The display device of claim 12, wherein in a plan view, the at least one third opening comprises a plurality of third openings, and the plurality of third openings are spaced side by side from each other in a direction.

17. The display device of claim 12, wherein in a plan view, the at least one third opening comprises:
a first portion;
a second portion intersecting the first portion; and
an intersection disposed between the first portion and the second portion.

18. The display device of claim 12, wherein in a plan view, the at least one third opening has a curved portion.

19. The display device of claim 12, wherein
a protection opening is defined in the organic protection layer, and
the protection opening overlaps the first opening and the second opening.

20. The display device of claim 19, wherein
the insulating layer further comprises at least one fourth opening that overlaps the protection opening,
the at least one fourth opening being spaced apart from the at least one third opening,
at least one of the first opening and the second opening is disposed between the at least one third opening and the at least one fourth opening,
the at least one fourth opening comprises a plurality of fourth openings,
the plurality of fourth openings are spaced side by side from each other in a direction in a plan view, and
each of the plurality of fourth openings comprises one of a curved design or a straight segment design in a plan view, wherein the straight segment design includes a first sub portion, a second sub portion intersecting the first sub portion, and a sub intersection disposed between the first sub portion and the second sub portion.

* * * * *